United States Patent
Sakano et al.

(10) Patent No.: US 7,129,620 B2
(45) Date of Patent: Oct. 31, 2006

(54) VIBRATION WAVE LINEAR MOTOR AND LENS IMPLEMENT USING VIBRATION WAVE LINEAR MOTOR

(75) Inventors: Hiromichi Sakano, Tokyo (JP); Yasuo Sasaki, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 11/113,876

(22) Filed: Apr. 25, 2005

(65) Prior Publication Data
US 2005/0236931 A1    Oct. 27, 2005

(30) Foreign Application Priority Data
Apr. 26, 2004    (JP) .............................. 2004-129921

(51) Int. Cl.
*H01L 41/08* (2006.01)
*H02N 2/04* (2006.01)

(52) U.S. Cl. ............................ 310/323.09; 310/323.01; 310/323.02; 310/323.03; 310/323.04; 310/323.16; 310/323.17; 396/75; 396/85; 396/133

(58) Field of Classification Search ................ 310/312, 310/328, 323.01–323.04, 323.09, 323.16–323.17; 396/75, 85, 113
See application file for complete search history.

(56) References Cited

U.S. PATENT DOCUMENTS 5,850,117 A * 12/1998 Tobe et al. ................. 310/312

FOREIGN PATENT DOCUMENTS

| JP | 9-51687 | 2/1997 |
| JP | 09051687 A * | 2/1997 |

* cited by examiner

*Primary Examiner*—Darren Schuberg
*Assistant Examiner*—J. Aguirrechea
(74) *Attorney, Agent, or Firm*—Scully, Scott, Murphy & Presser PC

(57) ABSTRACT

The present invention comprises a first vibrator comprising a piezoelectric unit and at least one driving contacting part which vibrates by applying a predetermined voltage thereto, a second vibrator which comprises a piezoelectric unit and a plurality of driving contacting parts which vibrate by applying a predetermined voltage thereto, a pressing component which relatively presses the opposing parts of both the first vibrator and the second vibrator, and a driven component which is sandwiched between the first and second vibrators, in contact with the driving contacting part of the first and second vibrators which are pressed by the pressing component, and supported to enable movement with respect to the first and second vibrators in the long-side direction perpendicular to the direction relative to the opposing part.

20 Claims, 16 Drawing Sheets

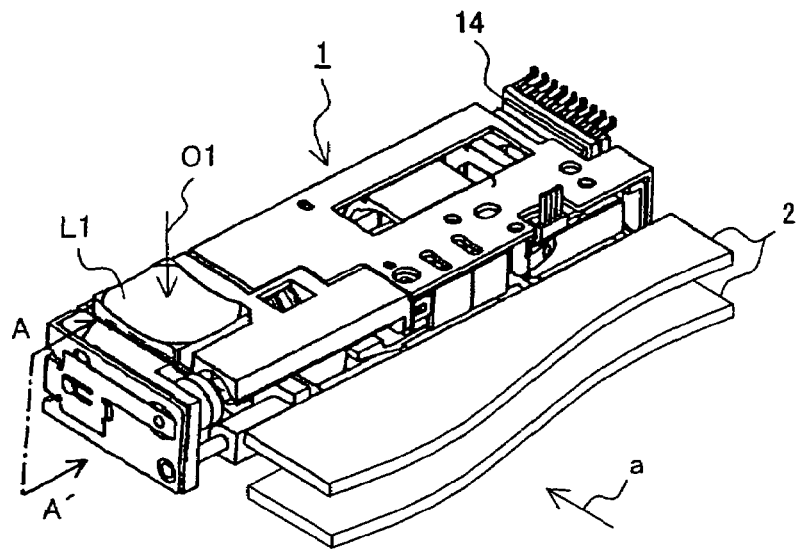
F I G. 1 A
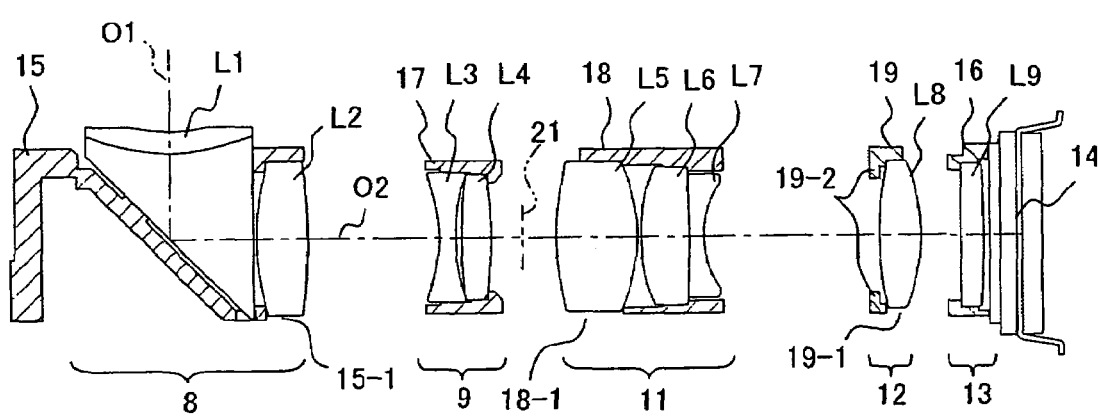
F I G. 1 B

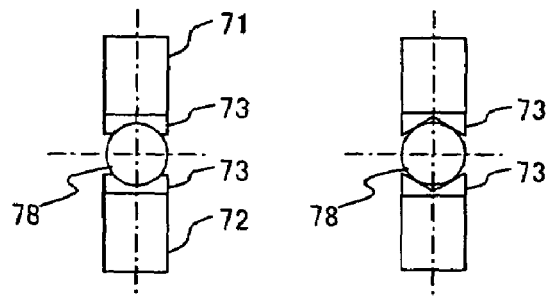
F I G. 5 A     F I G. 5 B
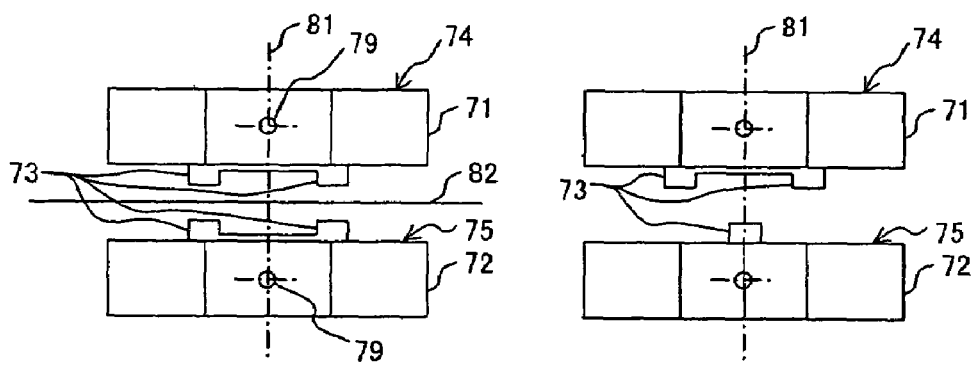
F I G. 5 C     F I G. 5 D
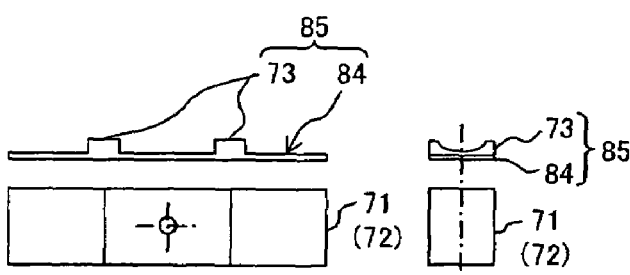
F I G. 5 E     F I G. 5 F
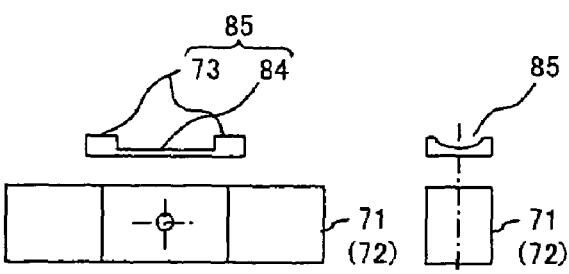
F I G. 5 G     F I G. 5 H

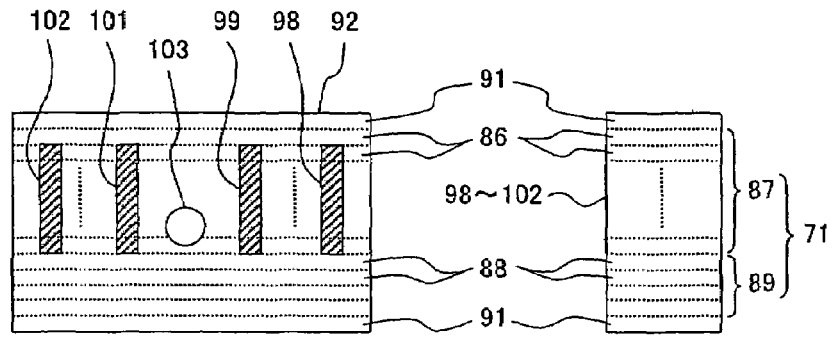
F I G. 6 A    F I G. 6 B
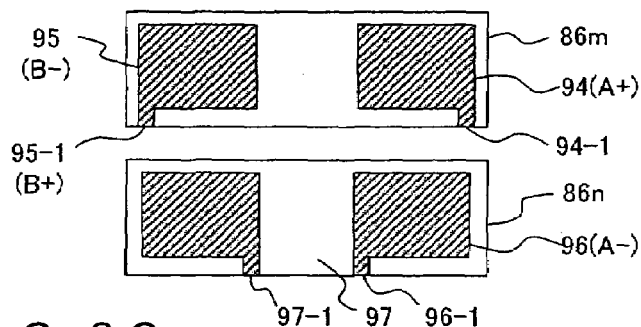
F I G. 6 C
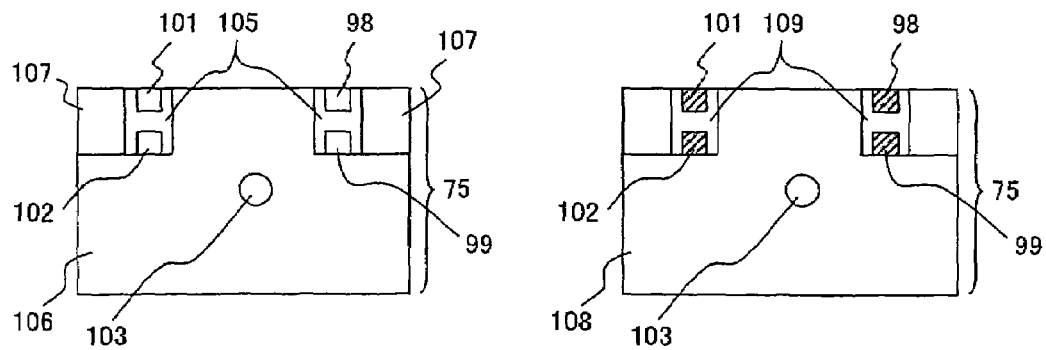
F I G. 6 D    F I G. 6 E

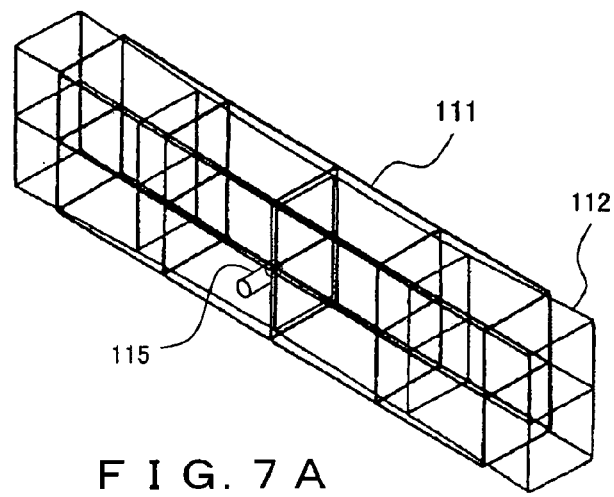
F I G. 7 A
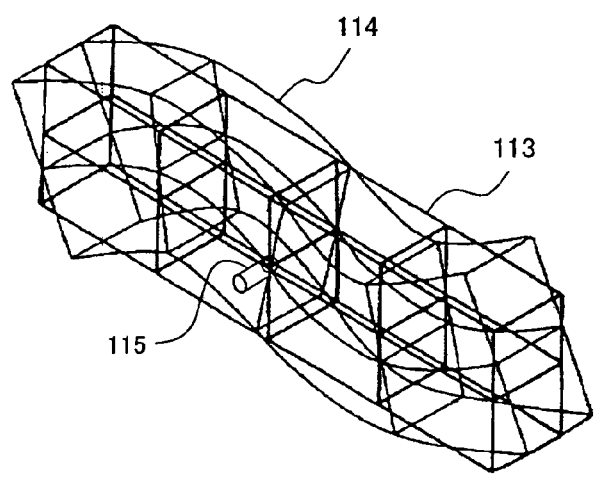
F I G. 7 B
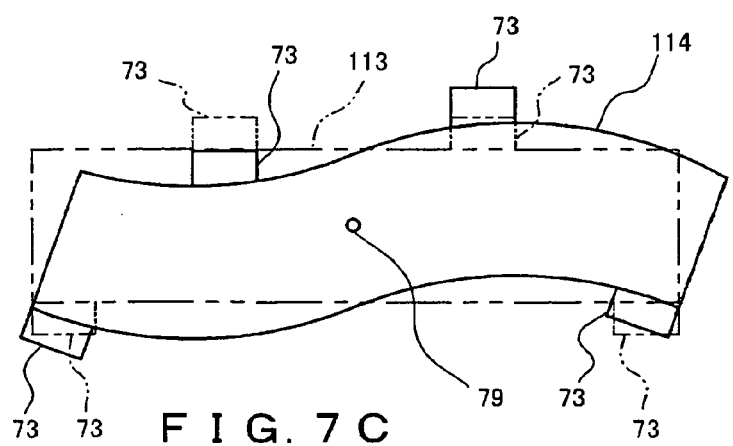
F I G. 7 C

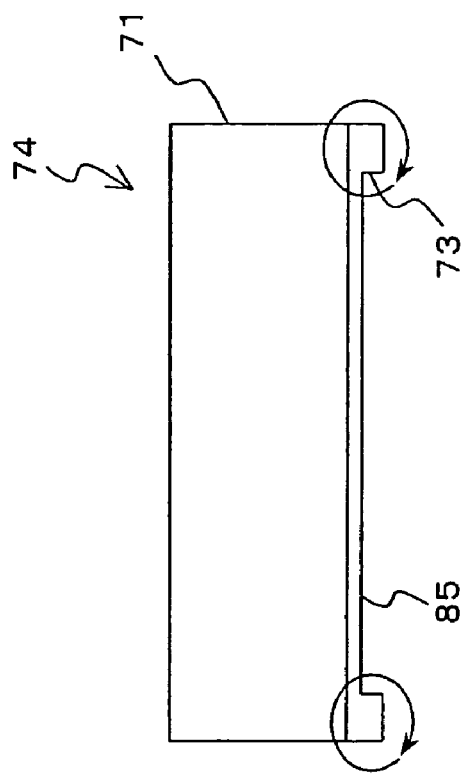
FIG. 8A
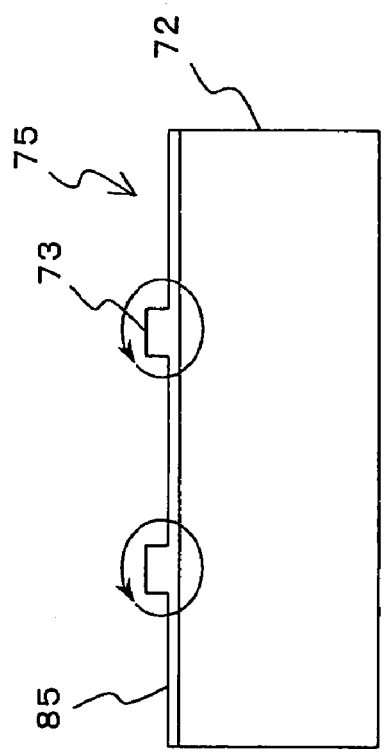
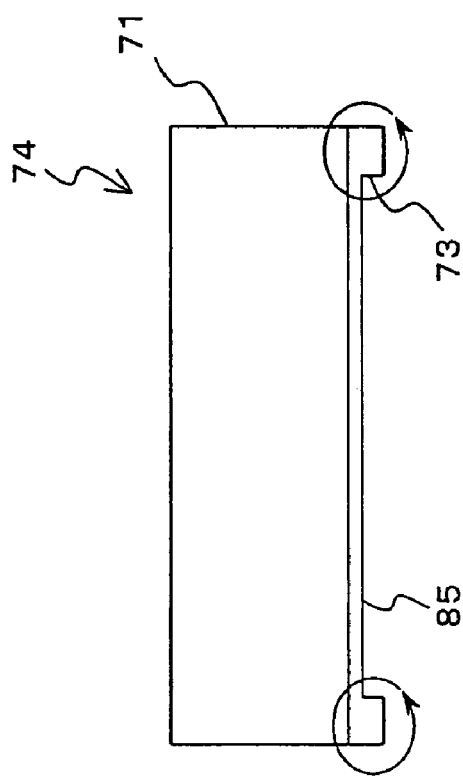
FIG. 8B
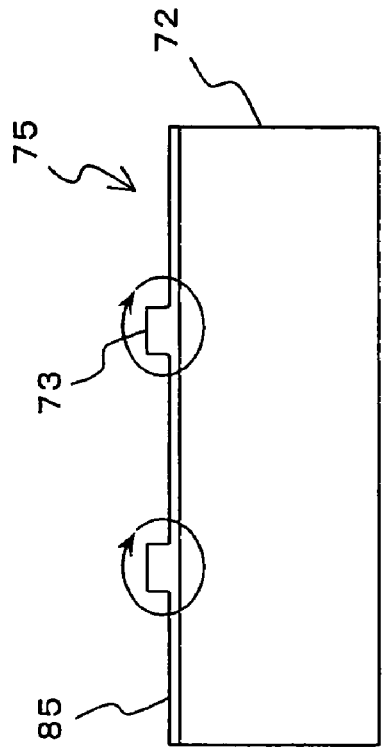

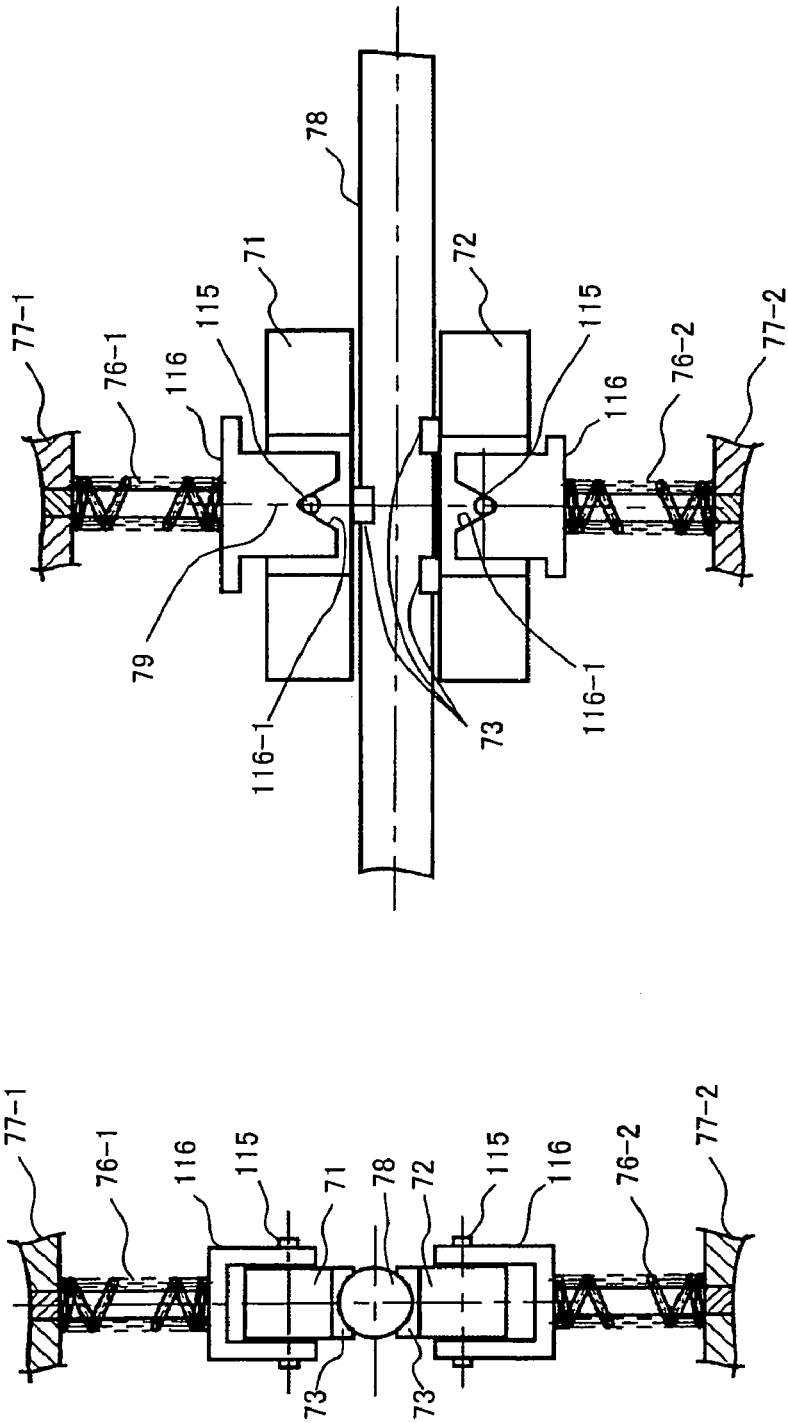

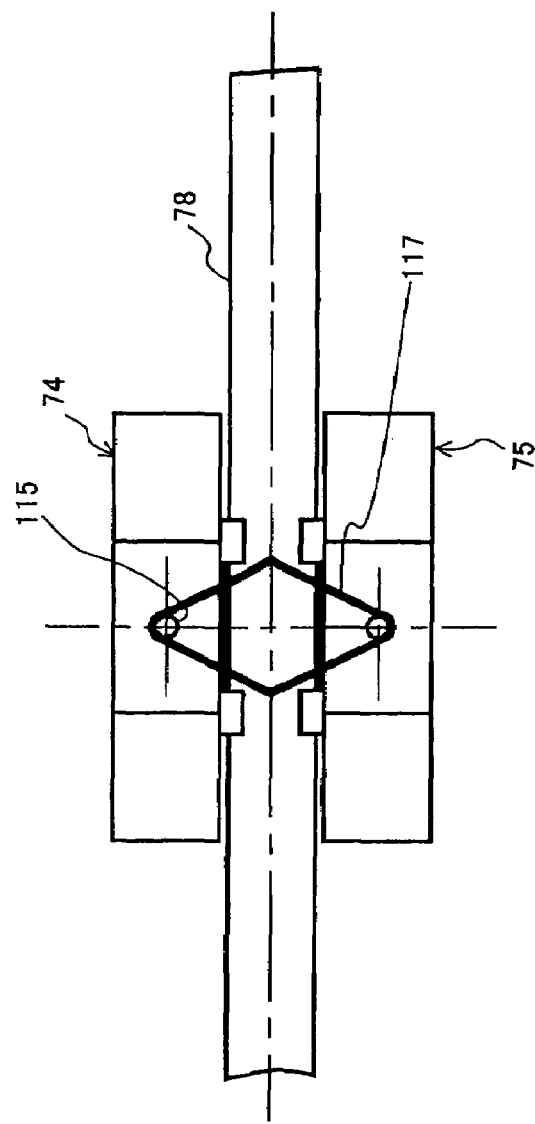
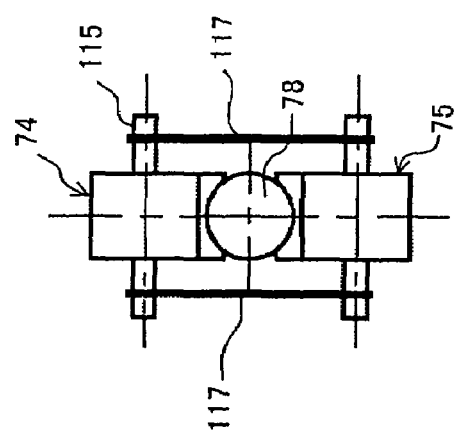
FIG. 11B
FIG. 11A

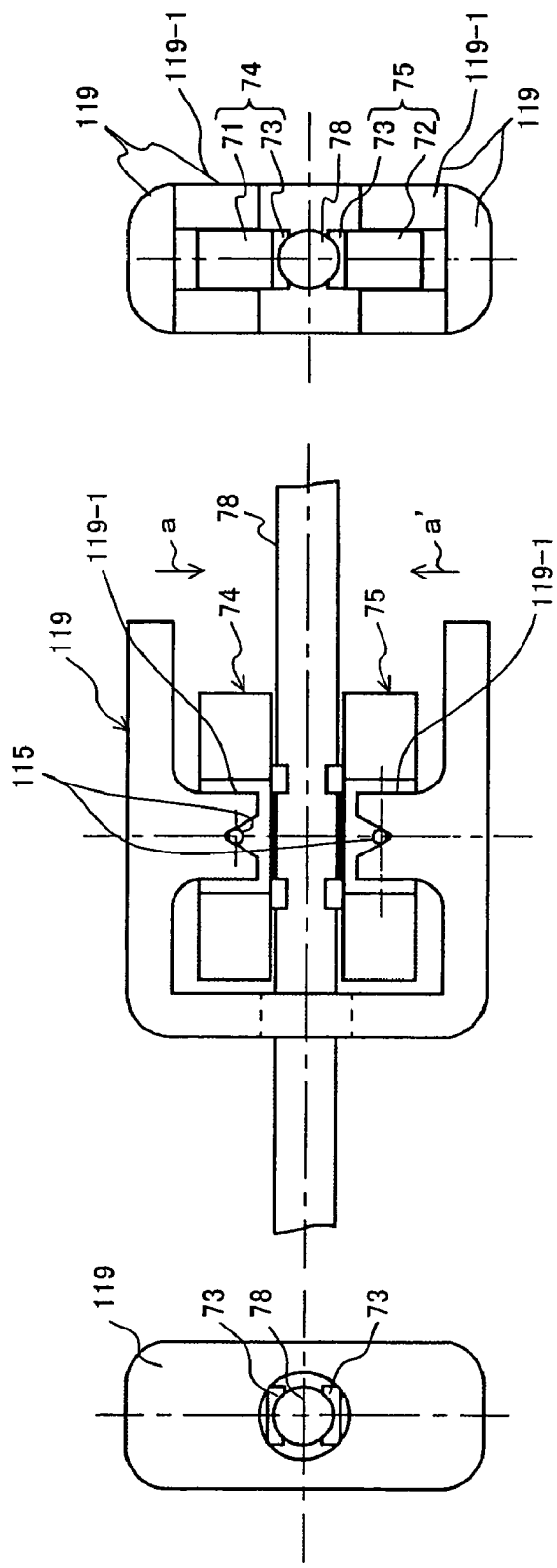

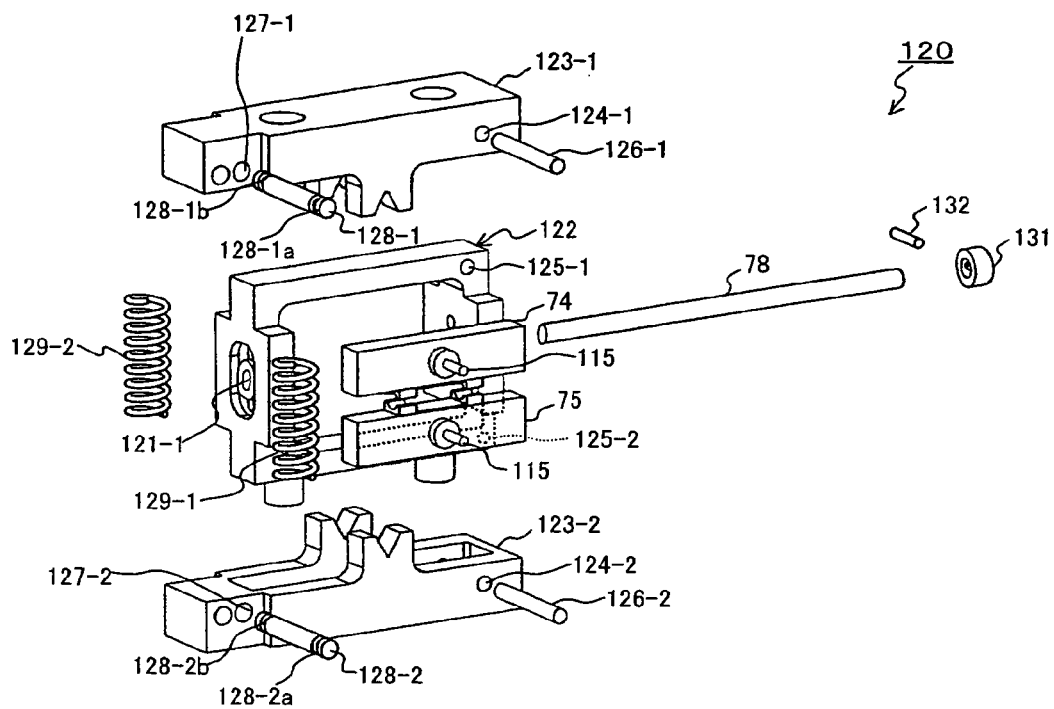
F I G. 1 4 A
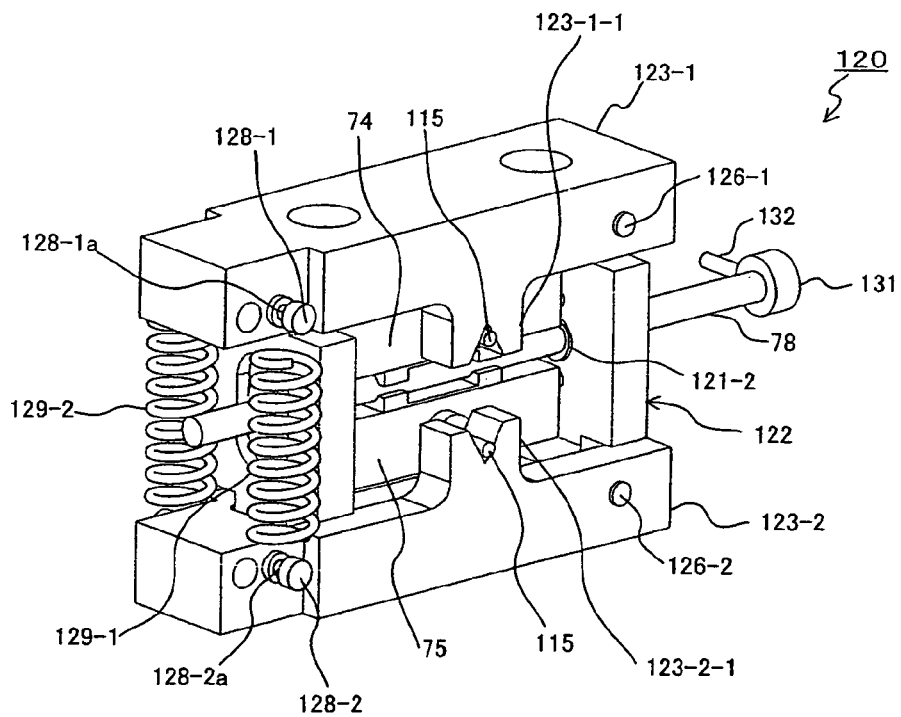
F I G. 1 4 B

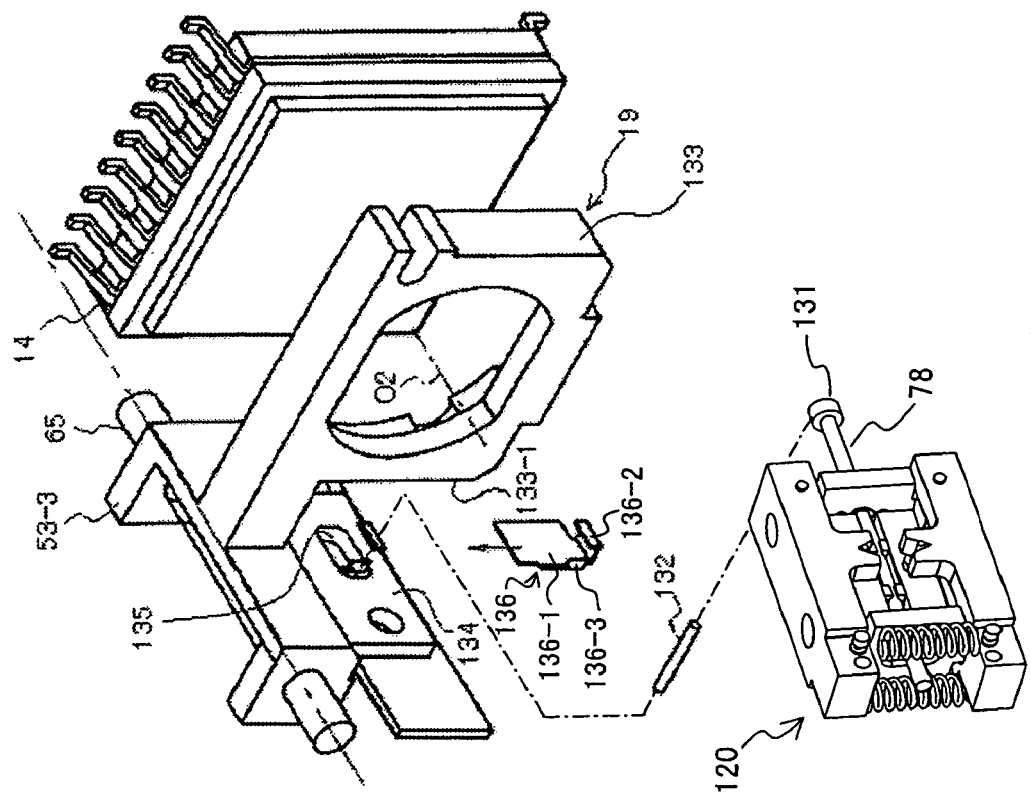
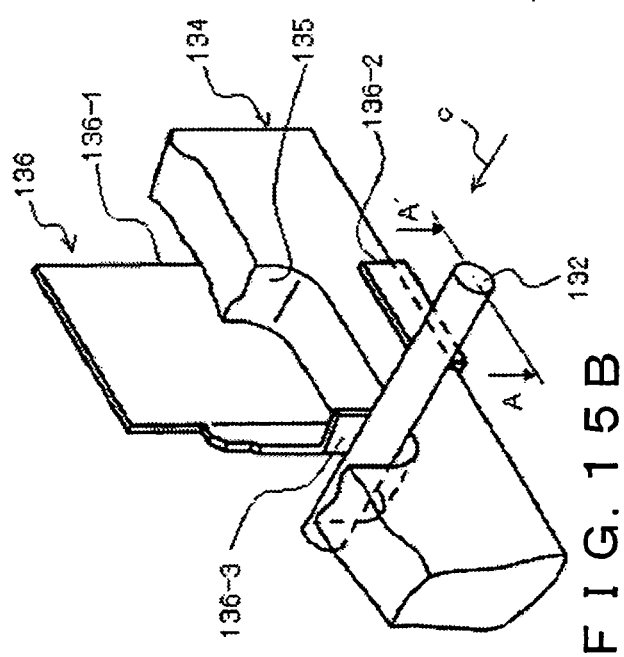
FIG. 15A
FIG. 15B

VIBRATION WAVE LINEAR MOTOR AND LENS IMPLEMENT USING VIBRATION WAVE LINEAR MOTOR

CROSS REFERENCE TO RELATED APPLICATION

This application is based upon and claims the benefit of priority from the prior Japanese Application No. 2004-129921, filed Apr. 26, 2004, the entire contents of which are incorporated herein by reference.

BACKGROUND OF THE INVENTION

1. Field of the Invention

The present invention relates to a vibration wave linear motor and lens implement using the vibration wave linear motor which implements ultrasonic vibrators, and in particular, a vibration wave linear motor and lens implement using the vibration wave linear motor with a simple configuration that can be miniaturized.

2. Description of the Related Art

In recent years, attention has been focused on ultrasonic motor (vibration wave motor) as a new motor to replace electromagnetic motor. This ultrasonic motor has advantages such as the following, in comparison to the conventional electromagnetic motor:

namely, (a) obtain high thrust at a low speed without a gear; (b) strong holding force; (c) long strokes and high resolution; (d) low noise; and (e) no generation of magnetic noise and no noise-influence.

As a conventional ultrasonic motor having these advantages, a linear ultrasonic motor wherein a movement part comprises two vibration boards, one guide shaft is held between the opposing parts of protruding parts which are formed, one on the opposing side of each of these vibration boards, and the movement part moves along the guide shaft by the vibration of the two vibration boards, is proposed. (For example, refer to paragraphs [0011] to [0012] and FIG. 1 of Japanese Patent Laid-Open Publication No. 09-051687.)

However, the technology in Japanese Patent Laid-Open Publication No. 09-051687 is prone to cause component to tilt in a plane formed by the driving direction of the guide shaft and the vibration boards with the driver protruding part as the fulcrum, because there is only one drive protruding part for each vibration board facing each other with the board in between.

In addition, the amplitude of the elliptical vibration at the protruding part functions to separate the vibration board and the guide shaft in the direction perpendicular to the guide shaft and enables relative driving of the guide shaft in the direction horizontal thereto. Drive is adversely affected if this tilting occurs because the elliptical vibration of said drive protruding part is optimized to achieve these functions.

If the tilting described above becomes too large, areas other than the drive protruding part, such as the vibration board and the guide shaft, come into contact. Vibrations in these areas generally work to inhibit the elliptical vibrations in the driving contacting part, and vibrations in a state of unnecessary contact may lead to destruction of the contacting parts.

Therefore, although it goes without saying that, first, a fixation component for fixing the guide shaft to the main body apparatus is necessary, engagement parts for the guide shaft is required in at least two locations in order to position the drive protruding parts to prevent tilting thereof to the guide shaft within the movement part. However, miniaturization of the entire configuration is difficult if there are many required configurations such as this.

Furthermore, in the configuration above, although it would appear that an attachment part is necessary to absorb error between the two, should a linear ultrasonic motor configured as such be applied to a drive wherein minor error is tolerated, for example a camera lens frame and the like, because the movement part is supported by the guide shaft without backlash, considerations such as this have not been made.

SUMMARY OF THE INVENTION

A vibration wave linear motor, within the vibration wave linear motor and lens implement using the vibration wave linear motor of the present invention, comprises: a first vibrator comprising a piezoelectric unit and at least one driving contacting part which vibrates by applying a predetermined voltage thereto; a second vibrator which comprises a piezoelectric unit and a plurality of driving contacting parts which vibrate by applying a predetermined voltage thereto; a pressing component which relatively presses the opposing part of both the first vibrator, above, and the second vibrator, above; and a driven component which is sandwiched between the first and second vibrators, above, in contact with the driving contacting part of the first and second vibrators which are biased by the bias component and supported to enable movement with respect to the first and second vibrators in the long-side direction perpendicular to the opposing direction relative to the opposing part. The vibration wave linear motor is configured so that at least one of the driving contacting parts of the first or second vibrator performs elliptic motion to enable the driven component to move relatively.

DESCRIPTION OF THE PREFERRED EMBODIMENTS

FIG. 1A is a perspective view showing the outer appearance of a lens implement comprising a vibration wave linear motor according to the present invention;

FIG. 1B is a cross section view showing a simplified configuration of lens unit parts when a cross section, taken along an arrow line A–A', of the lens implement shown in FIG. 1A is viewed in the direction of an arrow a;

FIG. 5A and FIG. 5B are diagrams showing a dimension example of the contacting surface of a driving contacting part to a shaft;

FIG. 5C and FIG. 5D are diagrams showing a positioning example of the driving contacting part to the main body of a vibrator;

FIG. 5E to FIG. 5H are diagrams showing configuration examples of the driving contacting part itself;

Figure 10B:
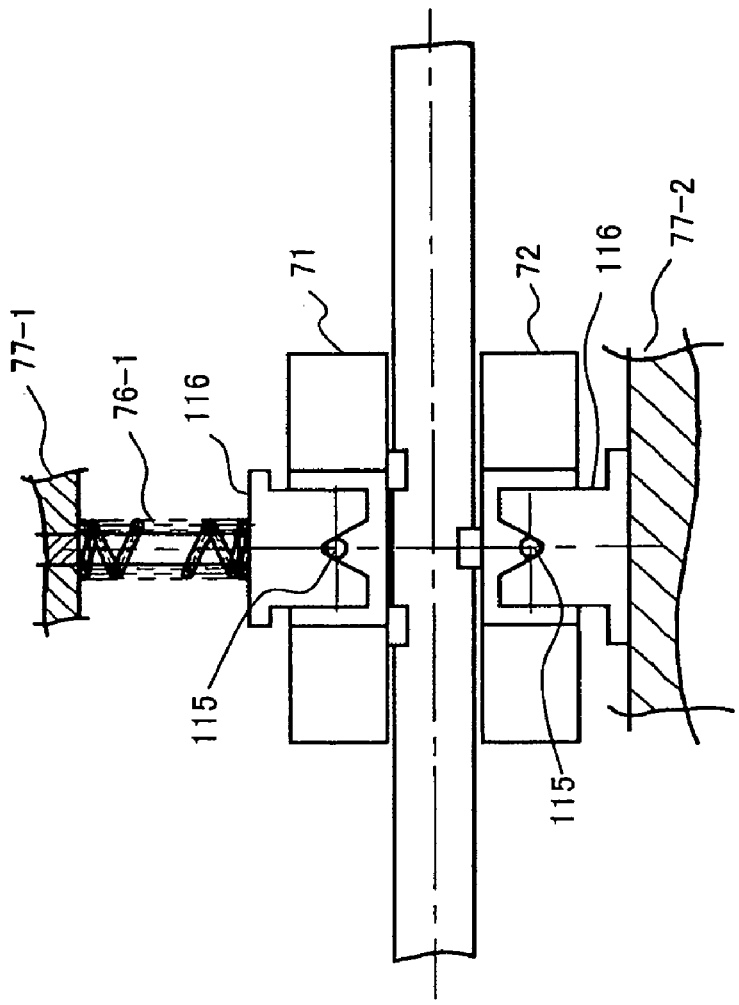
Figure 10A:
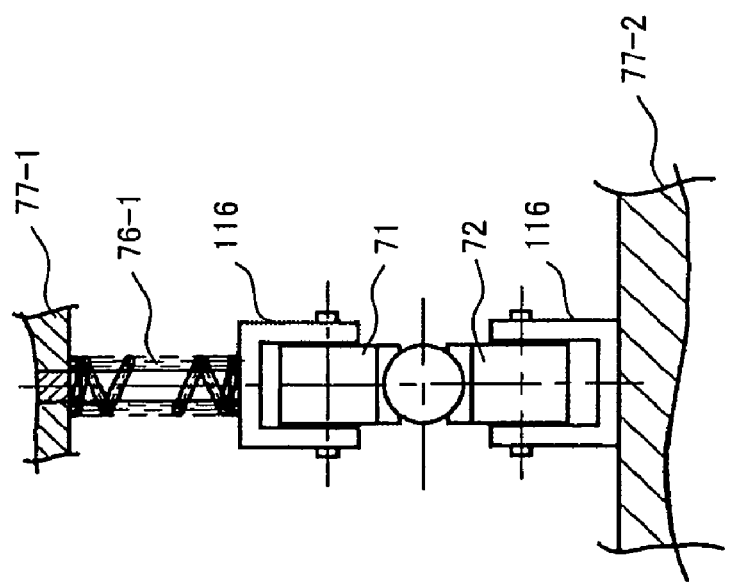
Figure 12A:
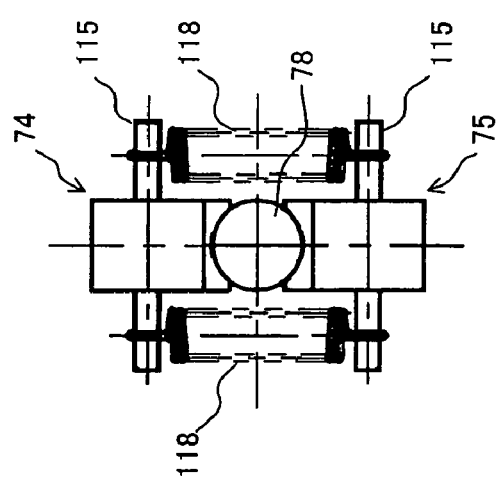
Figure 12B:
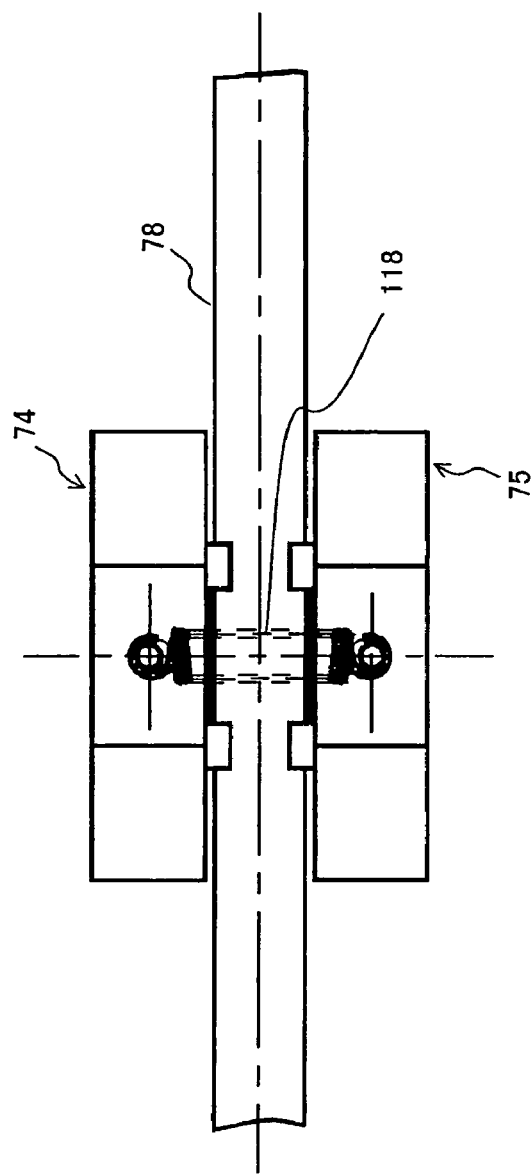
Figure 16A:
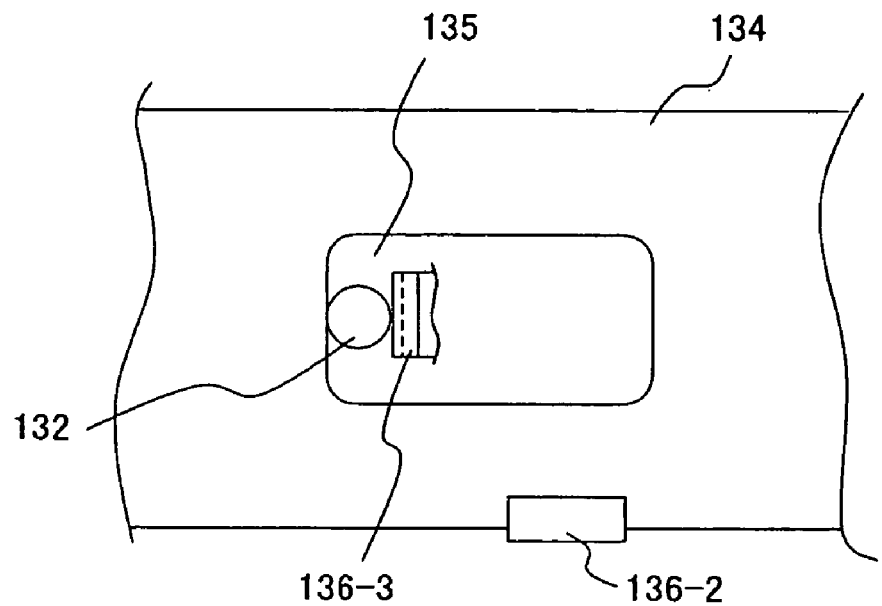
Figure 16B:
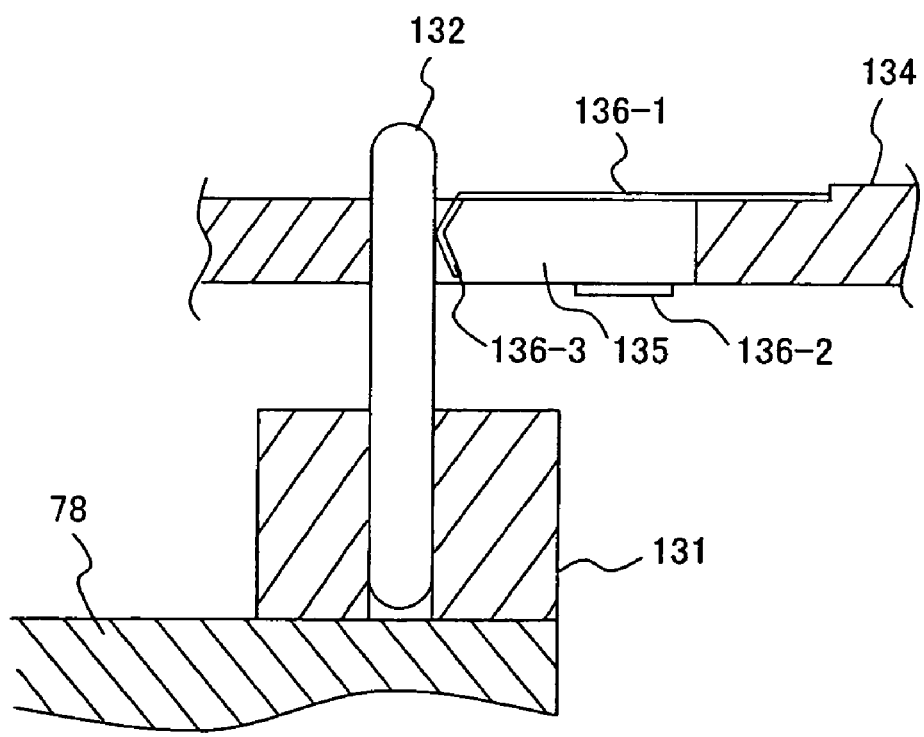

FIG. 6A front view of a vibrator of the vibration wave linear motor;

FIG. 6B is a side view of the vibrator shown in FIG. 6A;

FIG. 6C shows an arrangement of piezoelectric sheets and electrodes of the vibrator shown in FIG. 6A and FIG. 6B;

FIG. 6D and FIG. 6E are diagrams showing two examples of other configuration examples of the vibrator;

FIG. 7A and FIG. 7B are perspective views schematically explaining ultrasonic elliptical vibrations of the vibrator of the vibration wave linear motor which is vibration-driven by the voltage application to electrodes;

FIG. 7C is a diagram showing a secondary flexural vibration in a simplified manner through only the contour of the vibrator;

FIG. 8A and FIG. 8B are pattern diagrams showing the elliptical vibration of the driving contacting parts of the vibrator when an alternating current voltage having a phase that is different by π/2 in the neighborhood of the resonance frequency is applied;

FIG. 9A and FIG. 9B is a front and side view showing another example of the basic configuration of the vibration wave linear motor (1);

FIG. 10A and FIG. 10B is a front and side view showing another example of the basic configuration of the vibration wave linear motor (2);

FIG. 11A and FIG. 11B is a front and side view showing another example of the basic configuration of the vibration wave linear motor (3);

FIG. 12A and FIG. 12B is a front and side view showing another example of the basic configuration of the vibration wave linear motor (4);

FIG. 13A is a front view of an additional example of the basic configuration of the vibration wave linear motor;

FIG. 13B is a side view of the basic configuration in FIG. 13A;

FIG. 13C is a view of the basic configuration from the side opposite to that of FIG. 13B;

FIG. 14A is a perspective view showing the disassembly of the vibration wave linear motor implemented in the present invention;

FIG. 14B is a perspective view showing the vibration wave linear motor in FIG. 14A in an assembled state;

FIG. 15A is a perspective view explaining a method for joining the vibration wave linear motor and a third mobile lens frame;

FIG. 15B is an enlarged perspective view showing only the joining section in FIG. 15A;

FIG. 16A is a diagram showing FIG. 15B when viewed in the direction of an arrow c; and FIG. 16B is a cross-sectional view of FIG. 15B when taken along an arrow line A–A';

BEST MODE FOR CARRYING OUT THE INVENTION

A preferred embodiment of the present invention is explained below in reference to the diagrams. In the explanation below, the first vibrator stated in the Disclosure of the Invention is, for example, vibrator 75, the second vibrator is, for example, vibrator 74, the pressing part is, for example, compressed spring 76, and the driven component is, for example, shaft 78.

FIG. 1A is a perspective view showing the outer appearance of a lens implement comprising a vibration wave linear motor according to the present invention, whereas FIG. 1B is a cross-sectional view, taken along an arrow line A–A', of the lens implement shown in FIG. 1A when viewed in the direction of an arrow a in FIG. 1A, and shows a simplified configuration of the lens unit parts.

FIG. 1A also shows a part of a circuit board 2 comprising a control circuit which controls the driving of respective units of the lens implement 1 which is assembled within the housing of a main body apparatus such as a camera, etc. along with the lens implement 1.

The lens implement 1 shown in FIG. 1A reflects a beam of light from a subject, which is incident from a shooting lens window, not illustrated, of the housing of a main body apparatus to a lens L1 along a shooting optical axis O1 (indicated by the vertical direction in FIG. 1), to be bent almost at a right angle in the horizontal direction (an obliquely upper right direction in FIG. 1) by using a prism formed integrally with the lens L1.

This lens implement 1 generates a captured image by guiding the incident light beam to an image capturing element 14, which is provided at the end (the end in the obliquely upper right direction in FIG. 1) of the lens implement 1 and configured, for example, by a CCD and the like, along the bent second optical axis O2 shown in FIG. 1B.

As shown in FIG. 1B, the lens implement 1 comprises a plurality of lenses within, configured by a first fixed lens unit 8 composed of lenses L1 and L2, a first movable lens unit 9 composed of lenses L3 and L4, a second movable lens unit 11 composed of lenses L5, L6, and L7, a third movable lens unit 12 composed of a lens L8, and a second fixed lens unit 13 composed of a lens L9, along the second optical axis O2 which is bent in the horizontal direction.

Additionally, the image capturing element 14 is arranged at the end of this lens group.

The lens L1 of the first fixed lens unit 8 is formed integrally with a prism that changes the course of the light beam along the second optical axis O2 by reflecting the light beam from the subject, which is incident from the above described shooting lens window along the shooting optical axis O1, to be bent almost by 90° in the horizontal direction.

In addition, the lens L1 is held by a first fixed lens frame unit 15 along with the lens L2, and fixed within the lens implement 1.

The second fixed lens unit 13 described above is held by a second fixed lens frame unit 16 and fixed within the lens implement 1.

The first fixed lens frame unit 15 and the second fixed lens frame unit 16 are integrally formed by being molded with resin at the end of a metal frame, which will be described later and has an almost L-shaped cross-section cut perpendicular to the second optical axis O2, in a long-side direction.

Between the first fixed lens frame unit 15 and the second fixed lens frame unit 16, a first movable lens frame 17 holding the first movable lens unit 9, a second movable lens frame 18 holding the second movable lens unit 11, and a third movable lens frame 19 holding the third movable lens unit 12 are arranged.

The first movable lens frame 17, the second movable lens frame 18, and the third movable lens frame 19 hold the first movable lens unit 9, the second movable lens unit 11, and the third movable lens unit 12, respectively, to enable independent movement along the second optical axis O2 that is bent almost at a right angle by the lens L1 (also referred to as the prism L1, hereinafter).

The first movable lens unit 9 and the second movable lens unit 11 are provided to change the focal distance of the light beam of the subject, which is incident along the second optical axis O2 of the optical system of the lens implement 1.

In other words, the first movable lens frame 17 and the second movable lens frame 18, which respectively hold the first movable lens unit 9 and the second movable lens unit 11, are provided to adjust the zoom ratio of the lens system.

In addition, the third movable lens unit 12 is provided to adjust the focus at which the light beam forms an image on the image capturing element 14.

In other words, the third movable lens frame 19 holding the third movable lens unit 12 is provided as a lens frame for focusing, which can move freely in the direction of the second optical axis O2.

Furthermore, 21 between the first movable lens unit 9 and the second movable lens unit 11 indicates a position of an aperture.

Still further, this lens unit formed so that the thickness in the direction of height (actually, a thickness in the direction of depth as a lens unit for shooting) is as thin as possible.

Specifically, frame cut parts 15-1, 18-1, and 19-1 are formed by cutting at a part or the whole of frame walls in either of the upper or lower portions of the second optical axis O2 (portions corresponding to the bottoms of the lenses in the lower portion in the example shown in FIG. 1B), of the first fixed lens frame unit 15, the second movable lens frame 18, and the third movable lens frame respectively holding the first fixed lens unit 8, the second movable lens unit 11, and the third movable lens unit 12, which respectively comprise the lenses L2, L5, and L8 of a relatively large diameter.

In regards to the second and the third movable lens frames 18 and 19, the strengths of which become weak by the amount of the cut frame walls, and which do not particularly have other reinforced portions, unlike the first fixed lens frame 15, a later-described convex part which protrudes externally is provided on a side opposite to the cut part across the second optical axis O2, namely, from the upper frame wall.

The upper frame walls of the second and the third movable lens frames 18 and 19 look slightly thick in FIG. 1B because a cross-section of the convex part is depicted.

In addition, since the whole of the third movable lens frame 19 is thin and weak in the direction of width, reinforcement by only the above described convex part maybe insufficient. Therefore, a protruding part 19-2 is provided to wrap around from a lens barrel part formed on a side opposite to the cut part 19-1 formed at the lower side of the lens L8 towards the left hand side, which is out of range of the effective light beam of the lens L8.

Figure 2:
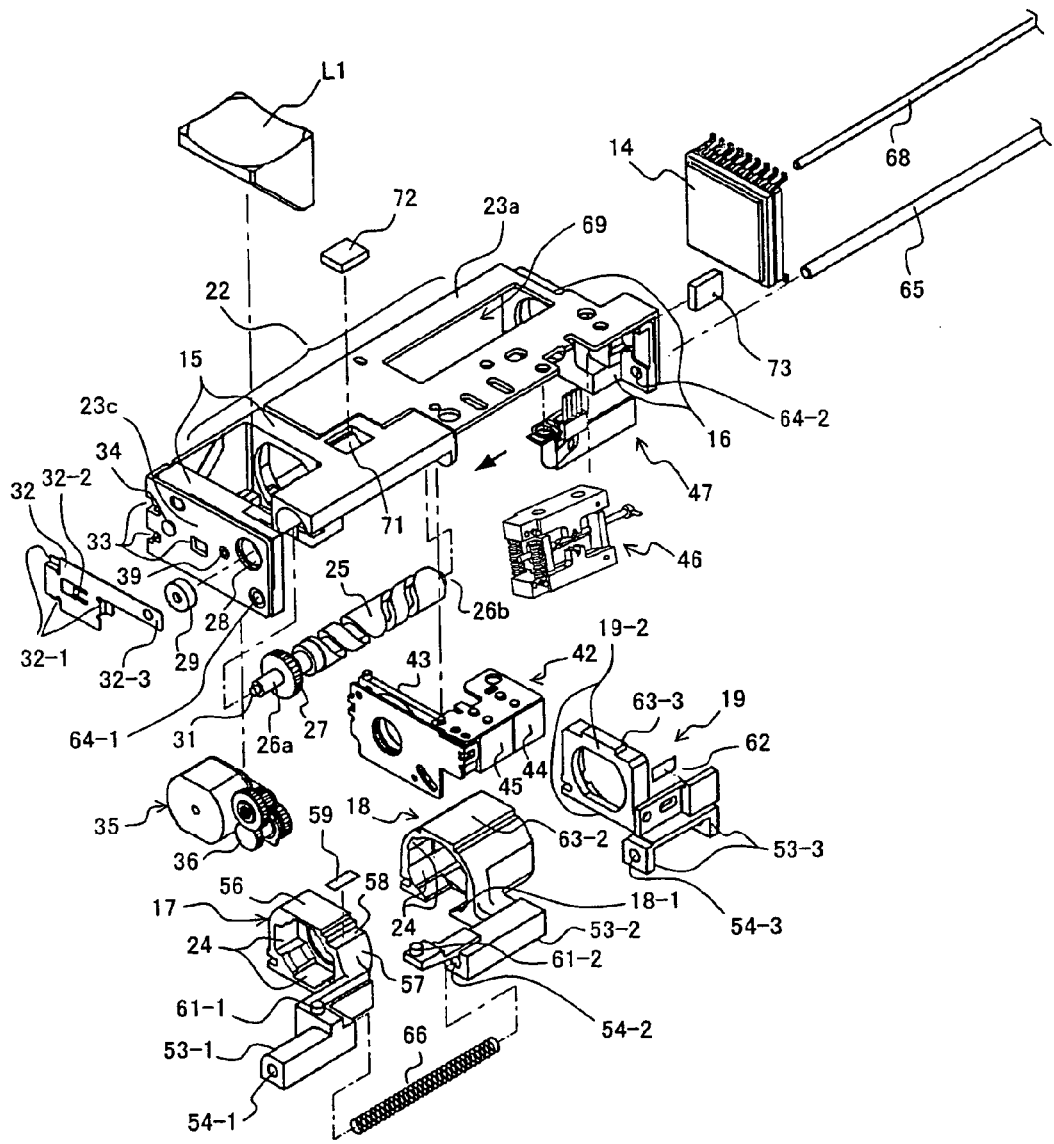
FIG. 2 is a perspective view showing the disassembly of the lens implement when viewed from above.

FIG. 2 is a perspective view showing the disassembly of the lens implement 1 when viewed from above.

Figure 3:
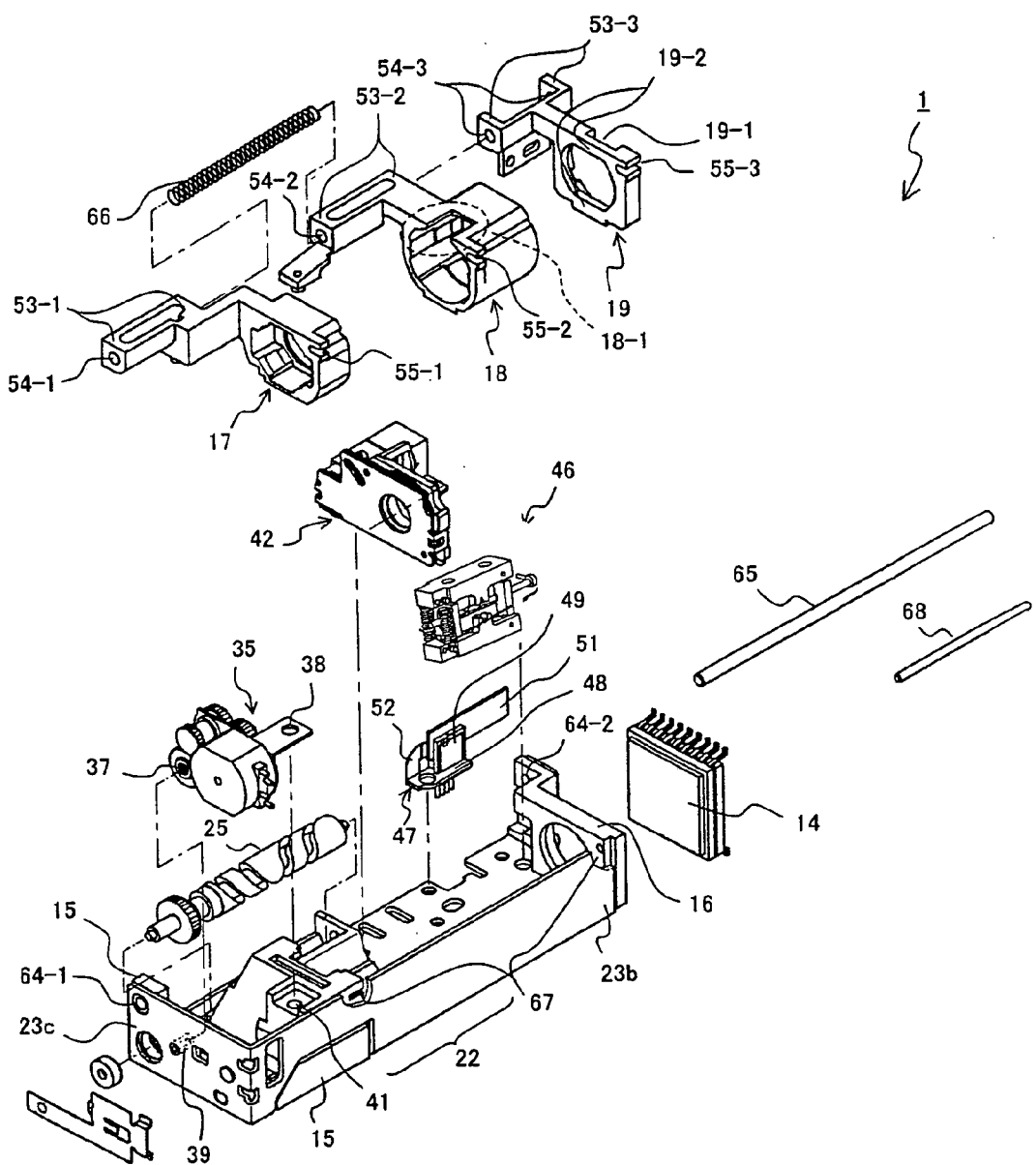
FIG. 3 is a perspective view showing the disassembly of the lens implement, upside down, when viewed from below.

FIG. 3 is a perspective view showing the disassembly of the lens implement 1, upside down, when viewed from below. In FIG. 2 and FIG. 3, constituent parts which are the same as those shown in FIG. 1A and FIG. 1B are denoted with the same reference numerals.

As shown in FIG. 2 and FIG. 3, above, the lens implement 1 comprises a main fixed lens frame 22.

When all of the constituent elements shown in FIG. 2 or FIG. 3 are assembled and accommodated inside and outside the main fixed lens frame 22, the whole of the lens implement 1 has an outer shape, shown in FIG. 1A, of the main body of the apparatus wherein the constituent elements are comprised on two main surfaces of opposing rectangles and in a flat space between the two main surfaces.

The above-described main fixed lens frame 22 comprises a metal frame 23a which forms at least one of the above-described two main surfaces. In the configuration of this lens implement 1, the other main surface is open.

Also, one side in the long-side direction of the flat space between one main surface which is formed by the metal frame 23a and the other open main surface is configured by a metal frame 23b connected almost at a right angle from the metal frame 23a on the one main surface.

Additionally, one side surface in the short-side direction (the side in the obliquely lower-left short-side direction in FIG. 2 and FIG. 3) is configured by a metal frame 23c which connected almost at a right angle to each of the metal frame 23a on the main surface and the metal frame 23b of the side surface in the long-side direction, as well.

In this way, the metal frame 23 (23a and 23b) configures an L-shaped metal frame, wherein the cross-section perpendicular to the long-side direction (also the direction of the above-described bent second optical axis O2) comprises one main surface and one side surface in the long-side direction, and has an ideal structure implementing high rigidity with a small amount of a material.

A fixed molded part formed integrally with the metal frame 23 by using outsert molding is formed, respectively, at both ends of the metal frame 23 in the long-side direction.

These two fixed molded parts are the first fixed lens frame unit 15 and the second fixed lens frame unit 16 which are also shown in FIG. 1B.

Furthermore, in the first fixed lens frame unit 15, the prism L1 also shown in FIG. 1B, and the lens L2 omitted in FIG. 2 and FIG. 3 are held and fixed.

Still further, in the second fixed lens frame unit 16, the lens L9 which is shown in FIG. 1B but omitted in FIG. 2 and FIG. 3 is held and fixed.

Between the first fixed lens frame unit 15 and the second fixed lens frame unit 16, the 3 movable lens frames (a first movable lens frame 17, a second movable lens frame 18, and a third movable lens frame 19), which are also shown in FIG. 1B, are arranged.

An adhesive deposit part 24 (refer to FIG. 2) which prevents adhesive which holds and fixes lenses from overflowing is formed in the three movable lens frames and the two fixed lens frames.

This adhesive deposit part 24 is a tiny space formed between the surface of the perimeter of the fixed lens and the lens frame.

Adhesive deposit parts of the third movable lens frame 19 and the second fixed lens frame unit 16 are not shown in FIG. 2 and FIG. 3 because they are hidden. In addition, an adhesive deposit part of the first fixed lens frame unit 15 is provided in the portion corresponding to the side-surface of the prism formed integrally with the lens L1, although this cannot be clearly seen.

Before the above-described three movable lens frames are assembled, a zooming shaft cam 25 is placed in proximity to the side-surface of the main fixed lens frame 22 on the open side in the long-side direction and to the side surface of the first fixed lens frame unit 15.

The zooming shaft cam 25 comprises a large diameter part forming a circular surface on which cam grooves of a cam unit are provided, and a small diameter part 26 (26a and 26b) which protrudes concentrically from both of the ends of the large diameter part. A gear 27 is fixed to the small diameter part 26a that protrudes from the end on the side opposite to the image capturing element 14.

After the small diameter part 26a of the zooming shaft cam 25 is inserted into a shaft bearing insertion hole 28 formed in a part bonded integrally with the metal frame 23c of the first fixed lens frame unit 15, the other small diameter part 26b is inserted into a shaft bearing hole, which is formed in the first fixed lens frame unit 15 and is hidden and cannot be seen in the diagram, while pulling the zooming shaft cam 25 in the obliquely right direction in the diagram, so that the small diameter part 26a is engaged with a shaft bearing 29 in the shaft bearing insertion hole 28.

As a result, the zooming shaft cam 25 is held to enable rotation to the first fixed lens frame unit 15.

A convex part 31 which has a smaller diameter is formed at the tip of the small diameter part 26a of the zooming shaft cam 25. This convex part 31 protrudes externally and upward from the shaft bearing 29 when the small diameter part 26a engages with the shaft bearing 29.

This convex part 31 is pressed by a pressing board spring 32, whereby the zooming shaft cam 25 is positioned by the upper and the lower shaft bearings and stably supported.

The pressing board spring 32 is configured by: three bent leg parts 32-1 which are formed by separating partially from an almost square main body with a notch, bending downward, and bending the tip to be horizontal; a stop segment 32-2 which is formed by cutting the center of the main body; and a pressing spring part 32-3 which is extended integrally from the main body.

On the other hand, on the side of the metal frame 23c, three notches 33 are formed in positions corresponding to the three bent leg parts 32-1 of the pressing board spring 32, and a convex part 34 which corresponds to the stop segment 32-2 of the pressing board spring 32 is formed almost at the center surrounded by the three notches 33.

When the main body of the pressing board spring 32 is pushed into the side of the metal frame 23c while engaging the three bent leg parts 32-1 of the pressing board spring 32 with the three notches 33 of the metal frame 23c, the tip of the stop segment 32-2 engages with the curved surface of the convex part 34, and as a result, the pressing board spring 32 is fixed on the outer surface of the metal frame 23c.

In addition, the convex part 31 of the zooming shaft cam 25 is pressed by the tip of the pressing spring part 32-3, and the zooming shaft cam 25 is positioned.

As a result, the zooming shaft cam 25 is arranged in proximity to the prism L1 which is held by the first fixed lens frame unit 15, the axis of which is in the long-side direction of the main fixed lens frame 22, namely, in parallel with the second optical axis O2, and arranged so that at least a portion in the axial direction is adjacent to the side surface of the prism L1.

Then, a zooming motor unit 35 is arranged in a space (refer to FIG. 3) shaped almost like a triangular pole, which is formed by a slope of the first fixed lens frame unit 15, which holds the back-side of the reflection plane of the lens (prism) L1, and the metal frame 23c, and its speed-reduction gear train 36 engages with the gear 27 of the zooming shaft cam 25.

This zooming motor unit 35 is fixed to the first fixed lens frame unit 15 by securing with screws two securing parts (refer to FIG. 3) of a gear shaft fixing part 37 and a securing board fixing part 38 to a positioning hole 39 formed on the first fixed lens frame unit 15 and to a securing hole 41.

Then, an aperture/shutter unit 42 is assembled to the main fixed lens frame 22.

The aperture/shutter unit 42 (see FIG. 2) comprises an aperture/shutter part 43 having an aperture, which controls the amount of passing light from the reflection light forming the second optical axis O2, and a shutter, and rotary solenoids 44 and 45 which mechanically drive the aperture and the shutter of the aperture/shutter part 43, respectively.

The aperture/shutter part 43 is arranged in the position 21 of the aperture shown in FIG. 1B, and the two rotary solenoids 44 and 45 are arranged below the zooming shaft cam 25.

Furthermore, a vibration wave linear motor 46 for moving and driving the third movable lens frame 19 and a magnetic sensor unit 47 are aligned overlapping in the short-side direction of the main fixed lens frame 22 below the aperture/shutter unit 42.

As a result, the vibration wave linear motor 46 is placed in a position in the extending direction of the shaft of the zooming shaft cam 25 and on the side of the image capturing surface.

The magnetic sensor unit 47 (refer to FIG. 3) comprises a magnetic sensor holder 48, a magnetic sensor 49, a magnetic scale 51, and a pressing spring 52.

The above-described vibration wave linear motor 46 and magnetic sensor unit 47 will be described in detail hereafter.

After the above-described components are arranged in this way, the first movable lens frame 17, the second movable lens frame 18, and the third movable lens frame 19, to which the movable lens parts 9, 11, and 12 shown in FIG. 1B (but omitted in FIG. 2 and FIG. 3) are respectively fixed with an adhesive, are assembled.

Although the following is not clearly shown in FIG. 1B because it is the cross-sectional side view, the top and the bottom (the top and the bottom also in FIG. 1B), in view of the lens implement 1 shown in FIG.1A, of each of the lenses L3 to L8 of the movable lens part 9, 11, and 12, which are respectively held by the first movable lens frame 17, the second movable lens frame 18, and the third movable lens frame 19 and shown in FIG. 1B, are cut to form flat surfaces, and the lenses are shaped like an oval when viewed from the front.

In addition, the top and the bottom surfaces (the top and bottom of the lens implement 1 shown in FIG. 1A, and the top and the bottom of the lens unit shown in FIG. 1B) of the lens holding units of the first, second, and third movable lens frames 17, 18, and 19 along the second optical axis O2 are formed to be flat in correspondence to the fact that they hold the oval-shaped lenses stated above. This enables a reduction in the thickness of the movable lens frames embedded in the lens implement 1.

For a further reduction in the thicknesses of the second and the third movable lens frames 18 and 19, frame walls, which correspond to the flat surfaces of the bottoms of the lenses, of the bottoms (the lower portions in FIG. 2, and the upper portions in FIG. 3) of the lens frames holding the lenses are cut to form cut parts 18-1 and 19-1, shown in FIG. 1B, and the flat parts of the bottoms of the lenses are exposed.

The above-described cut part of the second movable lens frame 18 is shown in FIG. 2 and FIG. 3. However, the cut part of the third movable lens frame 19 is not shown because it is hidden by the remaining peripheral portion of the lens frame.

The first movable lens frame 17, the second movable lens frame 18, and the third movable lens frame 19 (refer to FIG. 2) respectively comprise shaft bearing parts 53 (53-1, 53-2, and 53-3), in which guide holes 54 (54-1, 54-2, and 54-3) are provided respectively.

In addition, the first movable lens frame 17, the second movable lens frame 18, and the third movable lens frame 19 respectively comprise U-shaped cut parts 55 (55-1, 55-2, and 55-3) at the ends opposite of the shaft bearing parts 53 (refer to FIG. 3).

Furthermore, on the first movable lens frame, a light reflecting component 59 is attached and arranged to an uneven part 58 formed on a boundary between the front outer surface 56 opposing a back portion, which has the above-described shaft bearing parts 53-1 and the U-shaped cut part 55-1 (see FIG. 2), and a side surface 57 where the shaft bearing parts 53-1 are arranged.

Still further, cam followers 61 (61-1, 61-2) are respectively formed in a portion which protrudes in the horizontal direction integrally with the shaft bearing part 53-1 of the first movable lens frame 17, and in a portion which is extends integrally with the shaft bearing part 53-2 of the second movable lens frame 18.

Still further, a light reflecting component 62 is attached to a side surface that is erected in the horizontal direction integrally with the shaft bearing part 53-3 of the third movable lens frame 19.

Still further, convex parts 63 (63-2 and 63-3) for reinforcement, which are explained in reference to FIG. 1B, are formed on the front outer surface opposite of the back portion having the shaft bearing parts 53 (53-2 and 53-3) and the U-shaped cut parts 55 (55-2 and 55-3).

These convex parts 63 are provided to reinforce the strength of the lens frame which is insufficient due to the frame wall cut corresponding to the bottom flat portion of the oval lens, in order to reduce the thickness of the entire apparatus.

In addition, a first guide shaft 65, both ends of which are supported by guide shaft supporting holes 64 (64-1 and 64-2) formed at corners closest to the open side surface and the open main surface of the first fixed lens frame unit 15 and the second fixed lens frame unit 16, respectively, is inserted into guide holes 54 of the three movable lens frames.

As a result, the first, second, and third movable lens frames 17, 18, and 19 (namely, the three movable lens parts 9, 11, and 12) are supported to enable movement in the direction of the second optical axis O2 shown in FIG. 1B.

Furthermore, the guide shaft supporting holes 64 (64-1, 64-2) which support the first guide shaft 65 are formed at the corners closest to the open side surface and the open main surface.

Therefore, the first guide shaft 65 is arranged to be as close as possible to the outermost portion wherein the open side surface and the open main surface join, within one main body of the lens implement formed by the main fixed lens frame 22

The first guide shaft 65, which is arranged to be as close as possible to the outermost portion, is supported by the shaft bearing parts 53 in this way, and thereby, the three movable lens frames are arranged within the narrow and flat main body of the apparatus without wasting space.

When the first guide shaft 65 is inserted, a compressed spring 66 which has pressing force is externally attached to the first guide shaft 65 between the shaft bearing part 53-1 of the first movable lens frame 17 and the shaft bearing part 53-2 of the second movable lens frame 18.

In addition, a second guide shaft 68 is arranged, both ends of which are supported by other two guide shaft supporting holes 67 (see FIG. 3) formed in positions closest to the closed side surface and the open main surface, which are configured by the metal frame 23b of the first fixed lens frame unit 15 and the second fixed lens frame unit 16, before the three movable lens frames are assembled.

The respective movable lens frames are rotated inside by using the second guide shaft 68 as a pivot after the above-described U-shaped cut parts 55 are supported to slide freely by fitting into the second guide shaft 68 horizontally, whereby cam followers 61 placed in the first movable lens frame 17 and the second movable lens frame 18 freely and smoothly penetrate into the cam grooves of the zooming shaft cam 25 to engage therewith, when the three movable lens frames are assembled.

Namely, cams (the cam grooves with which the cam followers 61-1 and 61-2 engage), which correspond to a plurality of lens frames (the first movable lens frame 17 and the second movable lens frame 18 in this example) are respectively formed in the zooming shaft cam 25.

The cam followers 61 penetrate into the cam grooves of the zooming shaft cam 25 as described above, whereby the zooming shaft cam 25, the first movable lens frame 17, and the second movable lens frame 18 engage with one another to slide freely.

In addition, the front outer surface 56 (see FIG. 2) of the first movable lens frame 17 is arranged in proximity to the back side of the metal frame 23a forming one main surface.

Then, the convex parts 63 for reinforcement, which are formed on the front outer surfaces of the second movable lens frame 18 and the third movable lens frame 19, penetrate into an opening part 69 which is also formed on the metal frame 23a.

This opening part 69 forms an opening which is vertically long according to the move stroke of a movable lens in order to avoid an interference with the movement of a movable lens (see the lenses L5 to L8 shown in FIG. 1B) that moves with the movement of the second movable lens frame 18 and the third movable lens frame 19, namely, in order to not interfere with the movement of the convex parts 63.

Hereafter, the above-described first guide shaft 65 is inserted into the guide hole 54 of the shaft bearing parts 53 of the movable lens frames, and the guide shaft supporting holes 64 at both of the ends.

As a result, the two guide shafts (65 and 68) are arranged to be adjacent to the zooming shaft cam 25 and in parallel with the shaft of the zooming shaft cam 25.

As described above, the shaft-shaped components are arranged to be mutually adjacent and in parallel, which contributes to the miniaturization of the entire device.

The three movable lens frames (17, 18, and 19), supported by the two guide shafts, are controlled to enable sliding in the direction of the optical axis O2, prohibited by one of the guide shafts from rotating around the other guide shaft, positioned in a direction perpendicular to the optical axis O2, and arranged within the main fixed lens frame 22.

In addition, the compressed spring 66 is arranged between the shaft bearing part 53-1 of the first movable lens frame 17 and the shaft bearing part 53-2 of the second movable lens frame 18, externally attached to the first guide shaft 65, whereby the first movable lens frame 17 and the second movable lens frame 18 are pressed in mutually reverse directions.

As a result, the cam followers 61-1 and 61-2, which respectively engage with the cam grooves of the zooming shaft cam 25, are respectively pressed against the opposite sides of the wall of the cam grooves of the zooming shaft cam 25.

Therefore, play generated between the cam grooves and the cam followers when the zooming shaft cam 25 is rotationally driven is eliminated. As a result, the position relationship, when the lens frames move to the left or to the right, is properly controlled.

In the above-described arrangement, the first guide shaft 65 is placed adjacent and almost in parallel with the zooming shaft cam 25.

Hereafter, the image capturing element 14 is installed on the bottom surface of the second fixed lens frame unit 16.

Additionally, a photo-sensor installment hole 71 is provided in a position which corresponds to the light reflecting component 59 attached to the first movable lens frame 17, on the surface of the first fixed lens frame unit 15 which exists on the same surface of the metal frame 23a. A photo-sensor 72 is placed in this photo-sensor installment hole 71.

This photo-sensor 72 detects the absolute position of the first movable lens frame.

The movement distance of the first movable lens frame from the detected absolute position is determined by detecting the movement position by counting the number of steps of a zoom motor of a zooming motor unit 35, which is driven in steps, by a control device which is not shown.

In addition, another photo-sensor 73 is arranged in a position which corresponds to the light reflecting component 62 attached to the third movable lens frame 19, on a side facing the open side of the second lens frame unit 16.

This photo-sensor 73 detects the absolute position of the third movable lens frame 19 by detecting the light reflected from the light reflecting component 62 attached to the third movable lens frame 19.

After these absolute positions are determined, the zooming shaft cam 25 rotates in both forward and backward directions within a predetermined angle range by forward and backward rotations of the motor of the zooming motor unit 35.

The cam follower 61-1 of the first movable lens frame 17 and the cam follower 61-2 of the second movable lens frame 18 engage respectively with the two cam grooves provided on the outer perimeter of the zooming shaft cam 25.

Through this, the first movable lens frame 17 and the second movable lens frame 18 (namely, the first movable lens unit 9 and the second movable lens unit 11) move close to or apart from each other in the direction of the second optical axis O2. As a result, the image of the light beam proceeding in the direction of the optical axis O2 is zoomed in/out.

In addition, the aperture/shutter unit 42, shown in FIG. 1B, wherein the aperture/shutter part 43 is placed in the aperture position 21 between the first and the second movable lens implement 9 and 11, opens/closes the course of the light beam proceeding in the direction of the optical axis O2, and an optical filter (ND filter) controls the amount of light on the image capturing surface, as well.

A vibration wave linear motor that drives the movement of the third lens frame holding the third movable lens part 12 for focusing is described next.

Figure 4B:
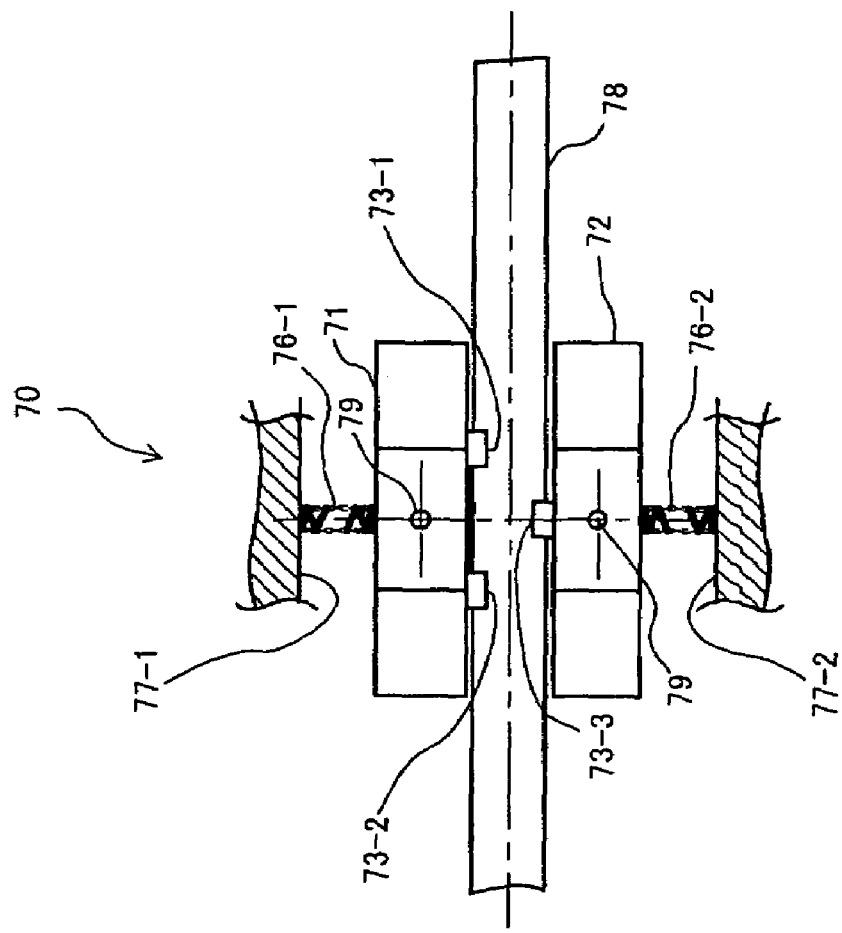
FIG. 4B is a side view of the vibration wave linear motor in FIG. 4A.
Figure 4A:
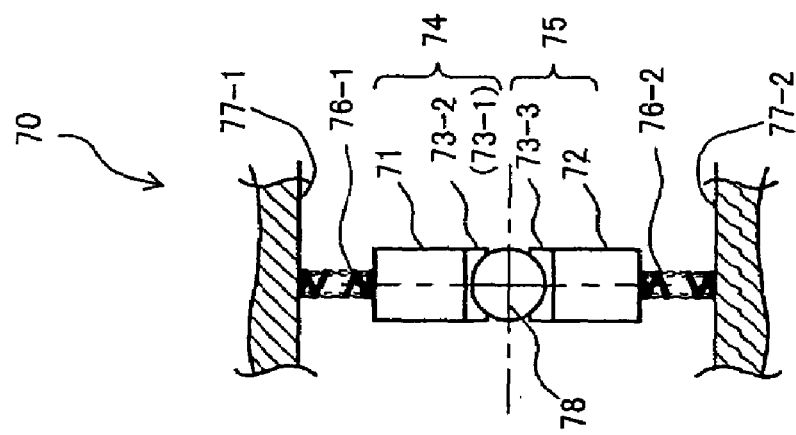
FIG. 4A is a front view showing the basic configuration of the vibration wave linear motor according to one embodiment.

FIG. 4A is a front view showing the basic configuration of the vibration wave linear motor implemented in the present invention, whereby FIG. 4B is a side view thereof.

As shown in FIG. 4A and FIG. 4B, a basic configuration 70 of the vibration wave linear motor first comprises two upper and lower vibrators 74 and 75, respectively comprising two rectangular vibrator units 71 and 72 and at least one (two for the upper vibrator unit 71 and one for the lower vibrator unit 72 in the example in the diagram) driving contacting part 73 (73-1, 73-2, and 73-3) of a protruding shape, which is formed integrally with two of the vibrator units 71 and 72, respectively, on the opposite surfaces on the top and the bottom of the vibrator units 71 and 72 or affixed separately.

In addition, in this basic configuration 70 of the vibration wave linear motor, two upper and lower compressed springs 76 (76-1 and 76-2) having pressing force which relatively presses the vibrator 74 and vibrator 75 towards each opposing part is attached respectively between upper and lower supporting components 77 (77-1 and 77-2), the upper surface of the upper vibrator 74 and the lower surface of the lower vibrator 75.

Furthermore, this basic configuration 70 of the vibration wave linear motor comprises a shaft 78 which is in contact with the driving contacting part 73 of the vibrators 74 and 75 which are pressed by the above-described two compressed springs 76, held between the two vibrators 74 and 75, and at the same time, is supported to enable movement in a long-side direction (depth direction in FIG. 4A and horizontal direction in FIG. 4B) perpendicular to the opposing direction relative to the opposing parts of each vibrators.

The pressing force of the compressed spring, above, is applied directly above (or directly below) the center part 79 which is the segment part of the vibrations of the vibrator units 71 or 72, and therefore, the pressing force from the compressed spring 76 is distributed evenly in front of and behind (horizontal direction in FIG. 4B) the center of the vibrator units 71 and 72.

The above-described three driving contacting parts 73 are configured so that at least one performs elliptical motion to move the shaft 78 relatively, as described in detail hereafter.

The vibrator units 71 and 72, described above, are each formed in a rectangular parallelepiped shape and the shaft 78 is formed so that the length of its movement direction is longer than the respective lengths of the vibrators 74 and 75, not only in the basic configuration described here, but also in the various examples shown below and in the vibration wave linear motor after actual assembly.

In addition, shaft 78 is formed in a linear shape, from a hollow or solid rod-shaped component. The shaft 78 in FIG. 4A and FIG. 4B is shown as a solid rod.

Furthermore, this shaft 78 is formed having the same width from one end of the rod-shaped component to the other end, and the cross-section is circular, as shown in FIG. 4A, namely the shaft in its entirety is formed in a cylindrical shape as shown in FIG. 4B.

Needless to say, the shaft 78 is not limited to a cylindrical shape, and although this is not illustrated in particular, the shaft can be a column having a triangular, rectangular, and other polygonal-shaped cross-section, according to the variant examples of the relative driving contacting part.

Additionally, the three driving contacting parts 73 which are pressured against this shaft 78 are arranged along the movement direction of the shaft 78.

The contacting part of these driving contacting parts 73 to the shaft 78 have a U-shaped or V-shaped cross-section (U-shaped in the diagram; V-shaped is described hereafter).

In this way, according to the vibration wave linear motor of the present invention, the shaft 78 is driven by the two vibrators 74 and 75, and therefore, a significant drive can be applied to the movement of the shaft 78.

In addition, because a plurality of driving contacting parts is in contact along the movement direction of the shaft 78, a stable direction can be maintained constantly for the movement direction of the shaft 78. Therefore, the shaft 78 can be driven while constantly maintaining appropriate contact.

Furthermore, because the movement direction of the shaft 78 can be controlled by the contact surface of the driving contacting parts 73, components for guiding the movement of the shaft 78 are unnecessary, and thereby, the number of components is reduced, contributing to the actualization of miniaturization and reduction of costs.

Still further, because the pressing force by the compressed spring 76 is distributed evenly in front of and behind the center of the vibrator units 71 and 72, the driving contacting part 73 can be in constant contact with the shaft 78 in accordance to the movement of the shaft 78, and therefore, the drive power of the vibrators 74 and 75 can be applied accurately and efficiently to the shaft 78.

FIG. 5A and FIG. 5B are diagrams showing an example of a cross-sectional dimension of the contacting surface of the driving contacting part 73 to the shaft 78. FIG. 5C and FIG. 5D are diagrams showing a positioning example of the driving contacting part to the vibrator unit. FIG. 5E to FIG. 5H are diagrams showing configuration examples of the driving contacting part itself.

FIG. 5A shows the same configuration as that in FIG. 4A, and the contacting part of the driving contacting part 73 to the shaft 78 has a U-shaped cross-section.

FIG. 5B shows an example wherein the contacting part of the driving contacting part 73 to the shaft 78 has a V-shaped cross-section.

In either case, the driving contacting part 73 is formed so that the contacting surface to the shaft 78 surrounds the shaft 78 halfway, whereby the shape of the driving contacting part 73 is configured to restrict the movement direction of the shaft 78 to the afore-described movement direction.

In addition, FIG. 5C shows a configuration in terms of arrangement comprising upper and lower vibrators 74 and 75 having two driving contacting parts 73 each.

In other words, this configuration comprises upper and lower vibrators 74 and 75 having a plurality of driving contacting parts each, and is configured so that its entirety is symmetrical to the line 81 which passes through a center part 79 which is the segment part of the vibrations of both vibrator units 71 and 72, described above, of vibrators 74 and 75, as well as symmetrical to the center axis 82 of the shaft 78 which is omitted in FIG. 5C.

In addition, FIG. 5D is a position configuration of the driving contacting part 73 which is the same as that shown in FIG. 4B.

In other words, this configuration is configured so that at least one driving contacting part 73 provided in the lower vibrator 75 is placed opposite, between the plurality of driving contacting parts 73 provided in the upper vibrator 74.

In this case also, this configuration is symmetrical to the line 81 which passes through the center part 79 which is the segment part of the vibrations of the vibrator units 71 and 72.

In either case, it is preferable that the vibrators 74 and 75 are configured so as to be symmetrical to at least the line 81 which passes through the center part 79, which is the segment part of the vibrations of the vibrator units 71 and 72, or to the center axis 82 of the shaft 78.

Furthermore, in FIG. 5C, FIG. 5D, FIG. 5G, and FIG. 5H, the plurality of driving contacting parts 73 are interlinked by a flat board part 84 to form linked driving contacting parts 85 and configured as components separate from vibrator units 71 or 72.

These linked driving contacting parts 85 are integrally configured with the vibrator unit 71 or 72 by adhesion during assembly.

The linked driving contacting parts 85, above, are formed so that at least one end matches the side surface of the vibrating units 71 or 72 (the side surface in the long-side direction in FIG. 5E and FIG. 5F; the side surface in the short-side direction in FIG. 5G and FIG. 5H).

In regards to FIG. 5E and FIG. 5F in particular, the size of the flat board part 84 for linking the plurality of driving contacting parts 73 of the linked driving contacting parts 85 is configured to match the size of one surface of the vibrator unit 71 (or 72) to which this linked driving contacting part 85 is affixed. As described above, the fact that the positioning of the driving contacting part is in a symmetrical form is convenient because there is no need to consider directionality during assembly, and the efficiency of assembly operation is enhanced.

In particular, a configuration wherein the driving contacting part is symmetrical to the shaft axis, such as that in FIG. 5C, is effective in reducing costs because vibrator components can be standardized, and in addition, there is no need to consider directionality when affixing the driving contacting part, facilitating assembly, and thereby enhancing the efficiency of assembly operation.

Furthermore, in either configuration, drive power to the shaft 78 is enhanced because the shaft is held and driven between the plural driving contacting parts 73 which are placed in opposite positions.

Still further, because the driving contacting part 73 embraces the shaft 78 halfway with the contacting surface to the shaft 78, the shaft 78 may shake vertically, but does not shake horizontally due to guidance from the embrace. In this way, the driving contacting part 73 functions both as a drive for the shaft 7 and as a guide for preventing horizontal shaking of the shaft 78.

Still further, because the driving contacting part 73 is configured by components separate from the vibrator unit 71 or 72, as are the linked driving contacting parts 85, these materials can be changed to various materials respectively and separately to enhance the performance of the driving contacting parts and the vibrators, thereby facilitating development for improving freedom of design and performance.

Still further, by forming the driving contacting parts as linked driving contacting parts, process steps are reduced in comparison to processing and affixing to the vibrator a plurality of driving contacting parts separately, thereby contributing to cost reduction.

Still further, because the linked driving contacting parts are formed so that at least one end matched the side surface of the vibrator, the positioning with the vibrator is facilitated, thereby enhancing assembling performance.

Here, the configuration of the vibration unit 71 (or 72; the same hereinafter) of the above-described vibration wave linear motor 70 is explained.

FIG. 6A is a front view of the vibrator unit 71 of the above-described vibration wave linear motor 70. FIG. 6B is its side view. FIG. 6C shows an arrangement of piezoelectric sheets and electrodes of the vibrator unit 71 shown in FIG. 6A and FIG. 6B. FIG. 6D and FIG. 6E respectively show two other configuration examples of the vibrator unit.

As shown in FIG. 6A and FIG. 6B, the vibrator unit 71 comprises: a piezoelectric sheet layer 87 composed of stacked piezoelectric sheets 86, and an elastic sheet layer 89 composed of elastic sheets 88 stacked below the piezoelectric sheet layer.

Insulation sheets 91 are respectively attached to the top surface of the piezoelectric sheet layer 87 and the bottom surface of the elastic sheet layer 89. This insulation sheet 91 can utilize the same material as the elastic sheet 88 which is originally an insulation material.

In addition, the driving contacting parts 73 or the linked contacting parts 85 are formed in close contact to the outside surfaces of either one of the insulation sheets 91, respectively.

The piezoelectric sheet layer 87 of the vibrator unit 71 configures a piezoelectric part mainly for providing a forcible vibration, whereas the elastic sheet layer 89 configures an excitation part for exciting particular vibration mode along with the piezoelectric part.

However, if desired vibration mode can be excited with only the piezoelectric part, the excitation part is not necessarily required.

The piezoelectric sheets 86 forming the piezoelectric sheet layer 87 and the elastic sheets 88 forming the elastic sheet layer 89 only differ in regards to whether or not an internal electrode process shown in FIG. 6C has been performed, and are originally thin rectangular sheet components made out of the same material such as PZT (titanic acid lead zirconate), for example.

Specifically, each sheet is, for example, 10 mm in length, 2.5 mm in width, and 80 μm in height (thickness in the stacking direction).

As the PZT material used in this embodiment, a hard material having a Qm value as large as 2000 is selected and used. The same material is used also for the elastic sheet.

In addition, the insulation sheets 91 which sandwich the piezoelectric sheet layer 87 and the elastic sheet layer 89 are made of the same PZT material, having a thickness of 40 μm.

Although these insulation sheets are made of the same material as that of the piezoelectric sheets, electrodes are not provided thereon. Therefore, the insulation sheets are not polarized, have no piezoelectricity, and therefore, have, in effect, characteristics as an insulation material.

The piezoelectric sheets 86 of the piezoelectric sheet layer 87 are configured by two types of sheet-state piezoelectric elements differing only in the electrode patterns for which the internal electrode process had been performed.

One of the two types of the piezoelectric sheets 86 is a piezoelectric sheet 86m partitioned into right and left portions, on which A+ internal electrode foil 94 and B− internal electrode foil 95 are formed on almost the entire surface, as shown in FIG. 6C.

Terminals 94-1 and 95-1, which are for the purpose of making external connections, are formed respectively on the A+ internal electrode foil 94 and the B− internal electrode foil 95, above, to protrude toward one side of the piezoelectric sheet 86m in positions close to both right and left ends.

The other type is a piezoelectric sheet 86n similarly partitioned into right and left portions, on which A− internal electrode foil 96 and B+ internal electrode foil 97 are formed almost on the entire surface.

Terminals 96-1 and 97-1, which are for the purpose of making external connections, are formed respectively on the A− internal electrode foil 96 and the B+ internal electrode foil 97, above, to protrude toward one side of the piezoelectric sheet 86n, which is the same as that of sheet 86m, in positions close to the center of the right and the left portions.

Silver-palladium alloy or silver is used as the electrode material for the above-described internal electrode foils. The electrode foils are formed to have a thickness of 4 μm by vapor deposition and a photolithography technique, for example.

In this preferred embodiment, the piezoelectric sheet layer 87 is configured by alternately stacking these two types of piezoelectric sheets 86m and 86n into a sheet layer of a total of 48 sheets composed of 24 sheets respectively.

In this way, in a middle portion excluding the topmost and the bottommost portions, internal electrodes are configured for applying voltages having reverse potentials to both of a piezoelectric sheet 86 (86m or 86n) on which one internal electrode foil is formed and a piezoelectric sheet 86 (86n or 86m) to which the internal electrode foils themselves contact.

In addition, the terminals 94-1, 95-1, 96-1, and 97-1 for external connections are formed to protrude toward one side of the piezoelectric sheet 86 (86m and 86n) from the above described A+ internal electrode foil 94, A− internal electrode foil 97, B+ internal electrode foil 97, and B− internal electrode foil 95, respectively.

The terminals 94-1, 95-1, 96-1, and 97-1, above, are connected respectively to an A+ electrode connecting external terminal 98, an A− electrode connecting external terminal 99, a B+ electrode connecting external terminal 101, and a B− electrode connecting external terminal 102, which are formed by baking silver, on one side surface of the vibrator unit 71 shown in FIG. 6A.

The A+ electrode connecting external terminal 98 and the A− electrode connecting external terminal 99 are configured as A phase electrodes, whereas the B+ electrode connecting external terminal 101 and the B− electrode connecting external terminal 102 are configured as B phase electrodes.

In this case, the A− electrode connecting external terminal 99 and the B− electrode connecting external terminal 102 are configured to connect to A phase and B phase grounds (GNDs), respectively. Therefore, in this case, these terminals may be connecting to the same lead wire and the like and configured to have the same electric potential.

A voltage is applied from a driving circuit, which is not particularly illustrated, to the piezoelectric sheet layer 87 via these A phase and B phase electrode connecting external terminals, whereby the vibrator 75 generates an ultrasonic elliptical vibration to be described later.

The vibrator unit 71 in this preferred embodiment is configured, for example, to be 10 mm in length, 2 mm in width, and 2.5 mm in height.

In this vibrator unit 71, a pin component attachment hole 103 is formed almost in the middle of the above-described A phase and B phase electrodes, namely, the position of the center part 79 which is the segment part of the vibration shown in FIG. 4B, FIG. 5C, FIG. 5D, FIG. 5E, and FIG. 5G, as shown in FIG. 6A. The pin component attachment hole 103 will be described later.

In addition, the piezoelectric unit is not limited to the piezoelectric sheet layer 87 and can be a configuration such as the following:

For example, FIG. 6D shows a configuration wherein the piezoelectric unit comprises piezoelectric parts 105 formed by stacked layer piezoelectric parts or piezoelectric elements, a vibrator unit principal part 106 made of brass, for example, and vibrator unit components 107, which are adhered and linked.

In this case, the vibrator unit principal part 106 and vibrator unit components 107 configure the excitation unit.

Furthermore, FIG. 6D shows a configuration where thin single board piezoelectric parts 109 are affixed to a rectangular elastic part 108 made of brass, for example.

In this case, the elastic part 108 configures the excitation unit.

Adhesion of these components by applying sufficient pressure when affixing these components is vital in increasing vibration transmission efficiency.

FIG. 7A and FIG. 7B are perspective views schematically explaining ultrasonic elliptical vibrations of the vibrator unit 71 of the vibration wave linear motor 70 that is vibration-driven by applying voltage to the electrodes in the configuration described above.

FIG. 7C is a diagram showing a secondary flexural vibration in a simplified manner, through only the contour of the vibrator.

First, if an alternating current voltage having the same phase in the neighborhood of the resonance frequency is applied to the A phase electrodes 98 and 99 and the B phase electrodes 101 and 102 of the vibrator unit 71 shown in FIG. 6A, a primary longitudinal vibration comprising a stationary position 111 and a resonance longitudinal vibration position 112 is excited in the vibrator unit 71.

In this case, the vibrator unit 71 expands and contracts in the long-side direction, and the vertical and horizontal dimensions of the center part also expand and contract.

In addition, if an alternating current voltage having a reverse phase in the neighborhood of the resonance frequency is applied to the A phase electrodes 98 and 99 and the B phase electrodes 101 and 102, a secondary flexural vibration comprising a stationary position 113 and a resonance flexural vibration position 114 is excited in the vibrator unit 71.

These vibrations were predicted through computer analysis implementing a finite element method, and the results of ultrasonic vibration measurement proved these predictions.

In FIG. 7C, the operation of the two driving contacting parts when the configuration comprises, aside from a stationary position 113 and a resonance flexural vibration position 114, the driving contacting part 73-1 and 73-2 arranged in the vibrator unit 71, shown in FIG. 4B, is shown in the upper portion.

In addition, in FIG. 7C, the lower potion shows the operation of the two driving contacting parts when arranged on both ends of the vibrator unit of the two driving contacting parts in the long-side direction, although this has not been shown in diagrams up until now.

In this way, in order to transfer motive energy from the vibrator to the driven component (shaft) efficiently, it is preferable that the driving contacting part is arranged in a position wherein the vibration of the vibrator in the direction opposite of the driven component (shaft) is the highest or fixed in close proximity thereto.

Furthermore, in FIG. 7A and FIG. 7B, a pin component 115 which is attached to the pin component attachment hole 103, shown in FIG. 6A, FIG. 6D and FIG. 6E and formed in the position of the center part 79 which is the segment part of the vibration shown in FIG. 7C, is shown.

In this preferred embodiment, the resonant frequency of the secondary flexion vibration is designed to be lower than that of the primary longitudinal vibration by several percent (preferably 3 percent or so).

With a configuration such as this, the output characteristic as the vibration wave linear motor can be significantly improved as will be described later.

Next, by applying an alternating current voltage having a phase difference by $\pi/2$ in the neighborhood of the resonance frequency to the A phase electrodes 98 and 99 and the B phase electrodes 101 and 102 of the vibrator unit 71, an elliptical vibration can be observed in the positions of the two driving contacting parts 73 placed on both ends in the long-side direction of the vibrator unit 71, shown in FIG. 7C, and the position of the two driving contacting parts 73 placed roughly in the middle of the end part and the center of the vibrator unit 72, shown in FIG. 7C.

In this case, the direction of the rotation of the elliptical vibration caused by ultrasonic vibration in the positions of the driving contacting parts 73 arranged on the bottom surface of the vibrator unit 71, and that of the rotation of the elliptical vibration caused by ultrasonic vibration in the positions of the driving contacting parts 73 arranged on the top surface of the vibrator unit 72 become reverse (refer to FIG. 8).

FIG. 8A and FIG. 8B schematically show the elliptical vibrations of the driving contacting parts of the vibrator when the alternating current voltage having the phase difference by $\pi/2$ in the neighborhood of the resonance frequency is applied.

Although the positions of the driving contacting parts 73 of the linked driving contacting parts 85 shown in FIG. 8A and FIG. 8B differ in the upper or the lower portion, they are indicated by the same number, as linked driving contacting parts 85. In addition, even when respective driving contacting parts 73 are individual driving contacting parts, the movement of the elliptical vibration explained below is the same.

FIG. 8A shows operations performed when the phase of the alternating current voltage applied to the A phase electrodes 98 and 99 is ahead by $\pi/2$ of the phase of the alternating current voltage applied to the B phase electrodes 101 and 102.

In this case, the driving contacting parts 73 on the bottom surface of the vibrator unit 71 rotate in a clockwise direction, whereas the driving contacting parts 73 on the top surface of the vibrator unit 72 rotate in a counter-clockwise direction.

FIG. 8B shows operations performed when the phase of the alternating current, which is applied to the A phase electrodes 98 and 99, is behind by $\pi/2$ of the phase of the alternating current voltage applied to the B phase electrodes 101 and 102.

In this case, the driving contacting parts 73 on the bottom surface of the vibrator unit 71 rotate in a counter-clockwise direction, whereas the driving contacting parts 73 on the top surface of the vibrator unit 72 rotate in a clockwise direction.

As described above, it is preferable that the driving contacting parts of the same vibrator are arranged in positions enabling rotation in the same direction, and the driving contacting parts of the vibrator on the opposite side are arranged in positions enabling rotation in the reverse direction.

In this way, the driving force to shaft 78 can be taken out most efficiently.

Namely, the elliptical vibration synthesized from the longitudinal vibration and the flexural vibration of the vibrator unit 71 and 75, above, acts on the guide shaft 78 via four driving contacting parts 73, and the shaft 78 moves forward and backward in the depth direction of the diagram of FIG. 4A, and the horizontal direction in FIG. 4B, following the guide by the contacting surface of the respective driving contacting parts 73 of the vibrator units 71 and 72.

This is the operational principle of the vibration wave linear motor according to the present invention.

In this preferred embodiment, the piezoelectric units are configured by two places: the A phase wherein the A phase electrodes 98 and 99 are arranged; and the B phase wherein the B phase electrodes 101 and 102 are arranged. However, the piezoelectric units are not limited to two places and can be three places or more, as long as they can generate longitudinal vibrations and flexural vibrations.

In addition, since the vibrator unit 71 has an almost rectangular parallelepiped shape in this preferred embodiment, in this case, the above-described driving force can be obtained by the longitudinal vibration and the flexion vibration.

However, the vibrator may be of another shape as long as the driving force can be obtained by generating the elliptical vibration in the driving contacting parts.

In addition, a similar vibration can be obtained by simultaneously exciting one or a plurality of modes of the same frequency or frequencies of an integer multiple.

Furthermore, it is preferable that the driving contacting parts are arranged in arbitrary positions wherein output characteristic of the highest level can be obtained as the vibrator linear motor, namely, positions where the ultrasonic elliptical vibration of the highest level of the vibrator units 71 or 72 is generated.

Normally, however, since generating an elliptical vibration becomes the source of drive, elliptical vibration occurs in one or more driving contacting parts. Therefore, the driving contacting parts must be arranged so that the total sum of driving force caused by a vibration that is generated in the positions of all of the driving contacting parts does not become zero.

Furthermore, it is unnecessary for elliptical vibrations to be generated in positions of all of driving contacting parts. As long as the total sum of driving force from driving contacting parts is not zero and the driving force is in one direction, it is irrelevant whether a single vibration or a vibration in a reverse direction occurs.

In any case, the shaft 78 can be driven with minimal input voltage utilizing the two upper and lower vibrators, by setting the positioning of the electrodes, the timing for the application of alternating current voltage, and the positioning of the driving contacting part accordingly.

Furthermore, in the example of the vibrator unit 71 shown in FIG. 8A and FIG. 8B, although the driving contacting part 73 is formed on the both ends of the vibrator unit 71 in the long-side direction, in this case, the shaft 78, shown in FIG. 4, which is the driven component must be formed to be longer than the largest positioning length of the plurality of driving contacting parts (two in the example in FIG. 8) of the vibrator, in regards to the length of the movement direction thereof.

FIG. 9A, FIG. 9B, FIG. 10A, FIG. 10B, FIG. 11A, FIG. 11B, FIG. 12A, and FIG. 12B are front views and side views of various variant examples of the basic configuration of the vibration wave linear motor, respectively.

In these diagrams, constituent parts which are the same as the configuration shown in FIG. 4A and FIG. 4B are denoted with the same reference numerals.

First, in FIG. 9A and FIG. 9B, the valley of the V-shape of the V-shaped engagement parts 116-1 of a pressing engagement component 116 with a cross-section in the shape of a square with one open side, which is arranged so as to hold the vibrator units 71 and 72 from both sides, respectively, is engaged to both ends of the pin component 115 (refer to the pin component 115 in FIG. 7A and FIG. 7B) which is inserted into the pin component attachment hole (refer to the pin component attachment hole 103 in FIG. 6A, FIG. 6D, and FIG. 6E) of the vibrator units 71 and 72.

Here, the compressed spring 76 (76-1 and 76-2) does not press the vibrator units 71 and 72 directly, as shown in FIG. 4A and FIG. 4B, but rather contacts the pressing engagement component 116, above, and presses the vibrators units 71 and 72 via the pressing engagement component 116 and the pin component 115.

In this way, because the vibrator units 71 and 72 are pressed via the pin component 115 which is inserted into the center part 79, which is the segment part of the vibrations of the vibrator units 71 and 72, the vibrator can be pressed to the shaft 78 easily, with a configuration which does not inhibit displacement due to resonance of the vibrator.

In addition, because the pin component 115 is pressed in the center part which does not displace the vibrator, the vibrator can press the shaft evenly, and therefore, stable driving of the shaft 78 is possible. This can also be said when a plurality of driving contacting parts are arranged and pressed to the shaft, as in FIG. 8.

FIG. 10A and FIG. 10B is a configuration wherein the pressing engagement component 116 of one of either vibrator unit 71 or 72 (vibrator 72 in the example in FIG. 10) is fixed to the supporting component (77-2 in the example in FIG. 10) and only the other vibrator is pressed via the pressing engagement component 116 and the pin component 115, in the configuration in FIG. 9A and FIG. 9B.

In this way, the entire configuration can be miniaturized by one pressing component while maintaining the same features as the configuration in FIG. 9A and FIG. 9B.

FIG. 11A and FIG. 11B shows a configuration wherein the two vibrators are pressed only by the pressing component, eliminating assistance components for pressing such as support component 77 and pressing engage component 116, as in FIG. 9 and FIG. 10.

Namely, a rhombic wire spring which has pulling pressing power is respectively hung across both ends of the pin component 115 of the vibrators 74 and 75 which hold the shaft 78. In this way, the two vibrators 74 and 75 can easily press the shaft 78.

This configuration contributed to the miniaturization of the entire device because the press control of the two vibrators 74 and 75 to the shaft can be simplified, complicated controls become unnecessary, and the main components of the vibration wave linear motor can be configured as a unit.

In addition, the pressing components can be miniaturized because the pressing force to the two respective vibrators can be small. Furthermore, because the device can be unitized with only the vibrators, the shaft and the pressing component, the degree of freedom for the displacement of the vibrator to the shaft which is the driven component increases, making drivability possible.

In FIG. 12A and FIG. 12B, a helical spring 118 which also has a pulling pressing force, in place of the rhombic spring 117 in FIG. 11A and FIG. 11B, is hung across both ends of the pin component 115 of the vibrator 74 and 75, respectively. Other than the switching of the rhombic spring 117 and the helical spring 118, this configuration is the same as that of FIG. 11A and FIG. 11B in terms of capability and functions.

FIG. 13A is a front view of an additional example of the basic configuration of the vibration wave linear motor. FIG. 13B is its side view and FIG. 13C is the view from the opposite side.

In the configuration shown in FIG. 13A, FIG. 13B, and FIG. 13C, the pressing engagement component 116 shown in FIG. 9A, FIG. 9B, FIG. 10A and FIG. 10B is integrated with a pushing pressing component 119 which is similar to the compressed spring 76 and the like.

Namely, the portion which was the pressing engagement component 116 in FIG. 9A, FIG. 9B, FIG. 10A and FIG. 10B is the engagement part 119-1 of the pushing pressing component 119 in FIG. 13A, FIG. 13B, and FIG. 13C.

This pushing pressing component 119 has a pressing force wherein the upper and lower free end part shown in FIG. 13 B presses inward as shown by arrow a and arrow a' respectively, or in other words, the upper and lower engagement part 119-1 presses the respective pin component of vibrators 74 and 75 top to bottom and bottom to top.

In this way, the pressing component which presses the vibrators 74 and 75 are made of pressing components such as pulling spring, compressed spring, and board spring and is configured so as to continue providing a stable pressing force to vibrator 74 and 75 while moving the shaft 78 which is a driven component.

A configuration where forward and backward moving force of the shaft 78 by the elliptical vibration, such as that shown in FIG. 8A and FIG. 8B, of the driving contacting part 73 of the vibrator 74 and 75 in the vibration wave linear motor having the basic configuration such as that described above, is taken out as the moving driving force of the third movable lens frame 19 shown in FIG. 1 to FIG. 3 is described next.

FIG. 14A is a perspective view showing the disassembly of the vibration wave linear motor implemented in the present invention, and FIG. 14B is a perspective view showing the vibration wave linear motor in FIG. 14A in an assembled state.

As shown in FIG. 14A and FIG. 14B, the vibration wave linear motor 120 first comprises vibrators 74 and 75 comprising a rectangular parallelepiped vibrator unit 71 and 72 and a plurality of driving contacting parts 73 (two respectively in the examples in FIG. 14A and FIG. 14B), as shown in FIG. 9 to FIG. 13.

In the center part which is the segment part of the vibrations of these vibrators 74 and 75, pin component 115 is inserted respectively, and both of its ends protrude outwards from both sides of the vibrators 74 and 75, respectively.

In addition, the vibration wave linear motor 120 comprises a housing 122. The housing 122 stores the vibrators 74 and 75, above, in its upper portion and lower portion and prohibits movement to the long-side direction if these vibrators 74 and 75 (from obliquely lower left to obliquely upper right direction in FIG. 14A and FIG. 14B).

Furthermore, shaft insertion holes 121-1 and 121-2 to which shaft 78 is inserted are formed on both sides of the housing 122 in the long-side direction.

The shaft 78 which is inserted through the shaft insertion holes 121-1 and 121-2 is provided between the vibrators 74 and 75 which are stored in the upper portion and lower portion of the housing 122.

From the upper portion and lower portion of the housing 122, above, pressing engagement components 123-1 and 123-2 are combined to embrace the upper portion and lower portion of the housing 122.

Locking pin holes 124-1 and 124-2 are formed respectively in one end in the long-side direction of pressing engagement components 123-1 and 123-2 (obliquely upper right direction in FIG. 14A and FIG. 14B), and in correspondence to these locking pin holes, locking pin holes 125-1 and 125-2 are formed respectively in one end part in the long-side direction of the upper portion and lower portion of the housing 122.

Joining lock pin 126-1 is inserted into the locking pin hole 124-1 of the upper pressed engagement component 123-1 and the locking pin hole 125-1 of the housing 122 upper portion.

The pressing engagement component 123-1 swingablly locks on to the upper end part of the housing 122, using this joining lock pin 126-1 as a pivot.

On the other hand, the joining lock pin 126-2 is inserted into the locking pin hole 124-2 of the lower pressing engagement component 123-2 and the locking pin hole 125-2 of the housing 122 lower portion.

The pressing engagement component 123-2 swingablly locks on to the lower end part of the housing 122, using this joining lock pin 126-1 as a pivot.

In addition, pressing pin holes 127-1 and 127-2 are formed, respectively, on the other end parts in the long-side direction of the pressed engagement components 123-1 and 123-2 (obliquely lower left direction of FIG. 14A and 14B).

Pressing engagement pins 128-1 and 128-2 are inserted, respectively, into these pressing pin holes 127-1 and 127-2.

Stopping grooves 128-1a and 128-1b which are respectively notched along the circumference is formed on both end parts protruding outwards from the pressing engagement pin 128-1, and stopping grooves 128-2a and 128-2b which are respectively notched along the circumference is formed on both end parts protruding outwards from the other pressing engagement pin 128-2.

Although this is not shown clearly in FIG. 14B, both of the ends of one helical spring 129-1 which has a pulling pressing power is respectively locked on to the stopping groove 128-1a of the front side of the pressing engagement pin 128-1 and the stopping groove 128-2a of the front side of the pressing engagement pin 128-2.

Furthermore, the other helical spring 129-2 which has a pulling pressing power is respectively locked on to the stopping groove 128-1b of the back side of the pressing engagement pin 128-1 and the stopping groove 128-2b of the back side of the pressing engagement pin 128-2 (neither can be seen in FIG. 14B because they are hidden by other components).

In this way, the afore-described pressing engagement component 123-1-1 presses downward in its entirety with the joining lock pin 126-1 as the pivot.

Then, this pressing engagement component 123-1-1 engages with the pin component 115 of the upper vibrator 74 and presses the vibrator 74 downwards. The lower pressing engagement component 123-2 is pressed upwards in its entirety using the joining lock pin 126-2 as the pivot.

Then, the engagement part 123-2-1 of the pressing engagement component 123-2 engages with the pin component 115 of the lower vibrator 75 and presses the vibrator 75 upwards.

A nut 131 is fixed onto one end part (obliquely upper right direction in FIG. 14A and FIG. 14B) of the shaft 78 which is pressured and held by the vibrator 74 and vibrator 75.

A drive engagement pin 132 is fixed and attached to this nut 131 to be perpendicular to, horizontal to, and in the behind direction (obliquely upper left in FIG. 14A and FIG, 14B) of the axis of the shaft 78. The end of the drive engagement pin 132 cannot be seen in FIG. 14B because it is hidden by other components.

This drive engagement pin 132 moves according to the operation of the shaft 78, in correspondence with the back and forth movement of the shaft 78 in the long-side direction by the vibrator 74 and vibrator 75.

FIG. 15A is a perspective view explaining a method for linking the above-described vibration wave linear motor 120 and the third movable lens frame 19. FIG. 15B is an enlarged perspective view showing only the linked part.

FIG. 15A is a diagram showing the vibration wave linear motor 46 (120 in FIG. 15A) and the third movable lens frame 19 in FIG. 3.

In addition, FIG. 15A shows a drive engagement pin 132, which is provided to the nut 131 on the end part of the shaft 78 and extends in an obliquely upper left direction, detached from the nut 131 in its extending direction to make it easily comprehensible.

FIG. 16A is a diagram showing FIG. 15B when viewed in the direction of an arrow c, and FIG. 16B is a cross-sectional view of FIG. 15B when taken along an arrow line A–A'.

FIG. 16B also shows a cross-section of the drive engagement pin 132, as well as shaft 78 and nut 131.

As shown in FIG. 15A, the third movable lens frame 19 is configured by the lens frame unit 133 holding the third movable lens unit 12, a shaft bearing part 53-3, and an engaging protruding part 134 provided to protrude downward from the shaft bearing part 53-3.

A long hole 135, which extends in a direction parallel with the direction where the lens frame unit 133 moves along the optical axis O2, is provided almost in a central portion of the engaging protruding part 134.

In the long hole 135 (see also FIG. 16A and FIG. 16B), a board spring 136, which presses the portion (the long hole 135 of the engaging protruding part 134) where the drive engagement pin 132 for taking out a moving force abuts on the third movable lens frame 19, is engaged from the opposite side in this diagram.

The board spring 136 is configured by a flat main part 136-1, a locking part 136-2 which is bent in two stages toward the front and then upward from the bottom of the main part 136-1, and a pressing part 136-3 which is bent toward the front from the left end of the main part 136-1.

In this board spring 136, its locking part 136-2 locks onto the engaging protruding part 134 by wrapping around the bottom of the engaging protruding part 134, where the long hole 135 of the third movable lens frame 19 is formed, from the opposite side and holding.

As a result, the main part 136-1 of the board spring 136 is in close contact with the aperture on the opposite side of the long hole 135, and the pressing part 136-3 is inserted in a predetermined position within the long hole 135 from the opposite side.

Between the pressing part 136-3 and the left end of the long hole 135, a gap which is only wide enough for the drive engagement pin 132 for taking out a moving force to be inserted is formed.

Between a side surface 133-1 on the opposite side of the lens frame main unit 133 of the third movable lens frame 19 and a surface on the front side of the engaging protruding part 134, a clearance large enough for only arranging a flexible board connected to the A+ electrode connecting external terminal 98, the A– electrode connecting external terminal 99, the B+ electrode connecting external terminal 101, and the B– electrode connecting external terminal 102 of the vibrator unit 71 and 72 of the vibration wave linear motor 120, which are shown in FIG. 6, is formed.

When the vibration wave linear motor 120 is arranged in this clearance, the drive engagement pin 132 for taking out a moving force is inserted in the gap formed between the pressing part 136-3 and the left end of the long hole 135 as shown in FIG. 15B.

With this engagement, the movements of the drive engagement pin 132 for taking out a moving force is prohibited from movement in the direction of the second optical axis O2 within the long hole 135.

Meanwhile, the housing 122 of the vibration wave linear motor 120, shown in FIG. 14B, is placed fixed to the metal frame 23a which is shown in FIG. 2 but omitted from FIG. 15A.

As a result, the drive engagement pin 132 can faithfully transmit the movement of the shaft 78 of the vibration wave linear motor 120 in the direction of the optical axis O2 to the third movable lens frame 19.

On the other hand, play is allowed in the upward and downward movements of the drive engagement pin 132 in the above described engagement. This play absorbs oblique fluctuations in the vertical direction and the like of the vibrator units 71 and 72 and the shaft 78 which centers on the pin component 115 of the vibrator units 71 and 72.

Furthermore, the drive engagement pin 132 for taking out a moving force accurately transmits the direction and the force of the movement of the shaft 78 in the direction of the second optical axis O2 to the third movable lens frame 19, as described above. In the meantime, the drive engagement pin 132 absorbs the upward and downward movements of the shaft 78, which are influenced by the upward and downward movements due to the elliptical vibration and the like of the vibrator units 71 and 72, with the upward and downward movements within the long hole 135, and does not transmit to the third movable lens frame 19.

In this way, in the junction between the shaft 78 and the third movable lens frame 19, a linked state by the drive engagement pin 132 for taking out a moving force is formed, of which one end is fixed to the shaft 78 via nut 131 and the other end only abuts on the portion (the long hole 135 of the engaging protruding part 134) on the third movable lens frame 19 with the pressing force of the board spring 139. As a result, the movement force (driving force) of the shaft 78 is transmitted to the movement of the third movable lens frame 19.

As described above, the drive engagement pin 132 is a movement driving transmitting component for transmitting the movement driving force of the vibrator 70 outside (a movement driving mechanism within an electronic appliance, an element to be driven to move within a device) when the vibration wave linear motor 120 is comprised in an electronic appliance, device and the like.

Incidentally, it has been explained that the vibration wave linear motor 70 (or 120; same hereinafter) in this preferred embodiment has a relation wherein the shaft 78 and two vibrators 74 and 75 move relatively, in FIG. 4A and FIG. 4B described earlier.

If this is explained in FIG. 15A, in the case of FIG. 15A, the third movable lens frame 19 which is linked to shaft 78 via nut 131 and the drive engagement pin 132 is moved by the shaft 78 which moves to the fixed housing 122. For example, the front and back ends of the movement direction of the shaft 78 are held with an elastic components which do not interfere with the vibrations of shaft 78, these elastic components are fixed to the metal frame 23a, and the fixed adjoining part with housing 122 is formed on an appropriate area of the third movable lens frame 19.

Then, the shaft 78 is placed in a fixed position, the vibrators 74 and 75, namely housing 122, move relative to this shaft 78, and in other words, the third movable lens frame 19 which is fixed and adjoined to housing 122 moves.

Configurations such as this are possible, and hence this is an explanation that the shaft 78 and the two vibrators 74 and 75 have a relationship wherein movements are relative.

In any case, according to the vibration wave linear motor of the present invention, a driven component can be driven by two vibrators, thereby realizing a drive which has a large drive thrust and is high in efficiency.

In addition, because the cross-section of the contacting part of the driving contacting part to the driven component is a U-shape or a V-shape, the movement direction of the driven component can be controlled, and therefore, guide parts are unnecessary, the number of parts can be reduced, and a drive which is high in efficiency can be actualized in this respect, as well.

Furthermore, because the vibrator also fluctuates along with the movement of the driven component, the driving contacting part can be in constant contact with the driven component, and therefore, drive force of the vibrator can be transmitted accurately and efficiently to the driven component, and a drive which is high in efficiency can be actualized in this respect, as well.

Still further, because the vibrator unit and the driving contacting part are configured by separate components, materials can be changed to various materials individually for the enhanced performance of the vibrator unit or the driving contacting part, thereby facilitating improvement in performance including lifetime.

Still further, through linear drive, components such as lens frames which make linear movement can be driven directly, thereby, reducing mechanical loss and actualizing a drive which is high in efficiency.

Still further, if a camera lens frame is the driven component, because lens frames, such as focus lens frames, can be driven directly by linear drive, focusing time can be reduced, and fast shooting operations by the user can be handled, thereby facilitating the handling of quick shooting operations.

Still further, because lens frames can be directly driven by linear drive, mechanical loss can be reduced, thereby, extending the lifetime of the device.

What is claimed is:

1. A vibration wave linear motor comprising:
   a first vibrator comprising a piezoelectric unit and at least one driving contacting part which vibrates by applying a predetermined voltage thereto;
   a second vibrator which comprises a piezoelectric unit and a plurality of driving contacting parts which vibrate by applying a predetermined voltage thereto;
   one or more pressing components, which directly push either or both of the first and second vibrators and relatively press the opposing parts of both the first vibrator and the second vibrator; and
   a driven component which is sandwiched between the first and second vibrators, in contact with the driving contacting part of the first and second vibrators which are pressed by the pressing component, and supported to enable movement with respect to the first and second vibrators in the long-side direction perpendicular to the direction relative to the opposing part;
   wherein at least one of the driving contacting parts of the either the first or second vibrator performs elliptic motion to enable the driven component to move relatively.

2. The vibration wave linear motor according to claim 1, wherein the driven component is formed by a linear, hollow or solid rod-shaped component.

3. The vibration wave linear motor according to claim 2, wherein the driven component comprises a drive transmitting engagement part on one end of the rod-shaped component and is formed with the same width from one end of the rod-shaped component to the other end.

4. The vibration wave linear motor according to claim 1, wherein the driven component is longer, in terms of length of movement direction, than the length of the respective vibrator.

5. The vibration wave linear motor according to claim 1, wherein the driven component is formed to be longer, in terms of length of movement direction, than the longest positioning length of the plurality of driving contacting parts of the second vibrator.

6. The vibration wave linear motor according to claim 1, wherein the driving contacting part is configured so that the shape of the contacting surface of the driven component is configured to control movement direction of the driven component.

7. The vibration wave linear motor according to claim 1, wherein the driving contacting part is arranged along the movement direction of the driven component.

8. The vibration wave linear motor according to claim 1, wherein the driven component is formed in a column-shape and the contacting surface of said driving contacting part to the driven component has a U-shaped or V-shaped cross-section.

9. The vibration wave linear motor according to claim 1, wherein the main body unit of the first and second vibrator are formed in a rectangular parallelepiped shape, and the plurality of driving contacting parts is formed as an interlinked linked driving contacting part and is configured by components separate from the vibrator unit.

10. The vibration wave linear motor according to claim 1, wherein the linked driving contacting part is formed so that at least one end matches the side surface of said vibrator unit.

11. The vibration wave linear motor according to claim 1, wherein the linked driving contacting part has a flat board for attaching a plurality of the driving contacting parts, and the size of the flat board matches one surface to which the linked driving contacting part of the vibrator is affixed.

12. The vibration wave linear motor according to claim 1, wherein at least one driving contacting part provided in the first vibrator is placed opposite between a plurality of driving contacting parts provided in said second vibrator.

13. The vibration wave linear motor according to claim 1, wherein a plurality of driving contacting parts provided in the first vibrator and a plurality of driving contacting parts provided in the second vibrator sandwich the driven component and are placed in symmetrical positions.

14. The vibration wave linear motor according to claim 1, wherein a plurality of driving contacting parts provided in the first vibrator and a plurality of driving contacting parts provided in the second vibrator are placed in symmetrical positions along the movement direction of the driven component from the center of the vibrators.

15. The vibration wave linear motor according to claim 1, wherein the driving contacting parts are fixed and placed in the proximity of the position wherein the vibration of the vibrator which is in the opposite direction of the driven component is the highest.

16. The vibration wave linear motor according to claim 1, wherein the pressing component is a pressing component, such as pulling spring, compressed spring, board spring and the like, and configured to apply stable pressing force on the vibrators when the driven component is moving.

17. The vibration wave linear motor according to claim 1, wherein the pressing component is engaged to a pin which is provided in a center part, which is a segment part of the first and/or the second vibrators, and presses the first and second vibrators to the driven component.

18. The vibration wave linear motor according to claim 1, wherein the first or the second vibrator is fixed, and second or first vibrator is pressed towards the driven component by the pressing component.

19. The vibration wave linear motor according to claim 1, wherein the pressing component is placed on the outer surface of the driven component between the first and the second vibrators, and presses first or second vibrator towards the driven component.

20. A lens implement wherein a vibration wave linear motor according to claim 1 is installed as the driving source of a focusing lens.

* * * * *